United States Patent
Allegra

(10) Patent No.: US 10,763,432 B2
(45) Date of Patent: Sep. 1, 2020

(54) CHALCOGENIDE-BASED MEMORY ARCHITECTURE

(71) Applicant: Intel Corporation, Santa Clara, CA (US)

(72) Inventor: Mario Allegra, Monza (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/219,324

(22) Filed: Dec. 13, 2018

(65) Prior Publication Data

US 2020/0194670 A1     Jun. 18, 2020

(51) Int. Cl.
*H01L 45/00* (2006.01)
*G11C 13/00* (2006.01)
*H01L 27/24* (2006.01)

(52) U.S. Cl.
CPC ........ *H01L 45/141* (2013.01); *G11C 13/0004* (2013.01); *G11C 13/0026* (2013.01); *H01L 27/2481* (2013.01); *H01L 45/06* (2013.01); *H01L 45/122* (2013.01); *H01L 45/1253* (2013.01)

(58) Field of Classification Search
CPC . H01L 45/141; H01L 45/122; H01L 45/1253; H01L 27/24; H01L 27/2409; H01L 27/2436; H01L 27/2463; H01L 27/249
See application file for complete search history.

(56) References Cited

U.S. PATENT DOCUMENTS

| 8,730,710 B2 * | 5/2014 | Baek .................... G11C 5/025 365/148 |
| 9,728,584 B2 * | 8/2017 | Ramaswamy ........ H01L 27/249 |
| 2017/0287980 A1 * | 10/2017 | Fantini .................. H01L 27/249 |

* cited by examiner

*Primary Examiner* — Allison Bernstein
(74) *Attorney, Agent, or Firm* — Alliance IP, LLC

(57) ABSTRACT

A memory cell can include a chalcogenide material configured in an annular shape or a chalcogenide material substantially circumscribing an interior conductive channel. Such memory cells can be included in memory structures having an interior conductive channel and a plurality of alternating dielectric layers and memory layers oriented along the interior conductive channel. Individual memory layers can include a chalcogenide material substantially circumscribing the interior conductive channel.

27 Claims, 20 Drawing Sheets

CHALCOGENIDE-BASED MEMORY ARCHITECTURE

BACKGROUND

Chalcogenide materials have properties that invite their use in a number of applications such as ovonic threshold switches and phase change memory (PCM). For example, different physical states of the chalcogenide material can have different levels of electrical resistance. As one specific example, one state of a chalcogenide material, such as an amorphous state, can have a high electrical resistance, while another state, such as a crystalline state, can have a low electrical resistance. Different levels of electrical resistance can be used to store information (e.g. a plurality of memory states). Once the information is stored, the information can be read by detecting the electrical resistance of the material. The fact that each state persists once fixed makes chalcogenide materials valuable in non-volatile memory (NVM) structures and devices.

DESCRIPTION OF EMBODIMENTS

Figure 1A:
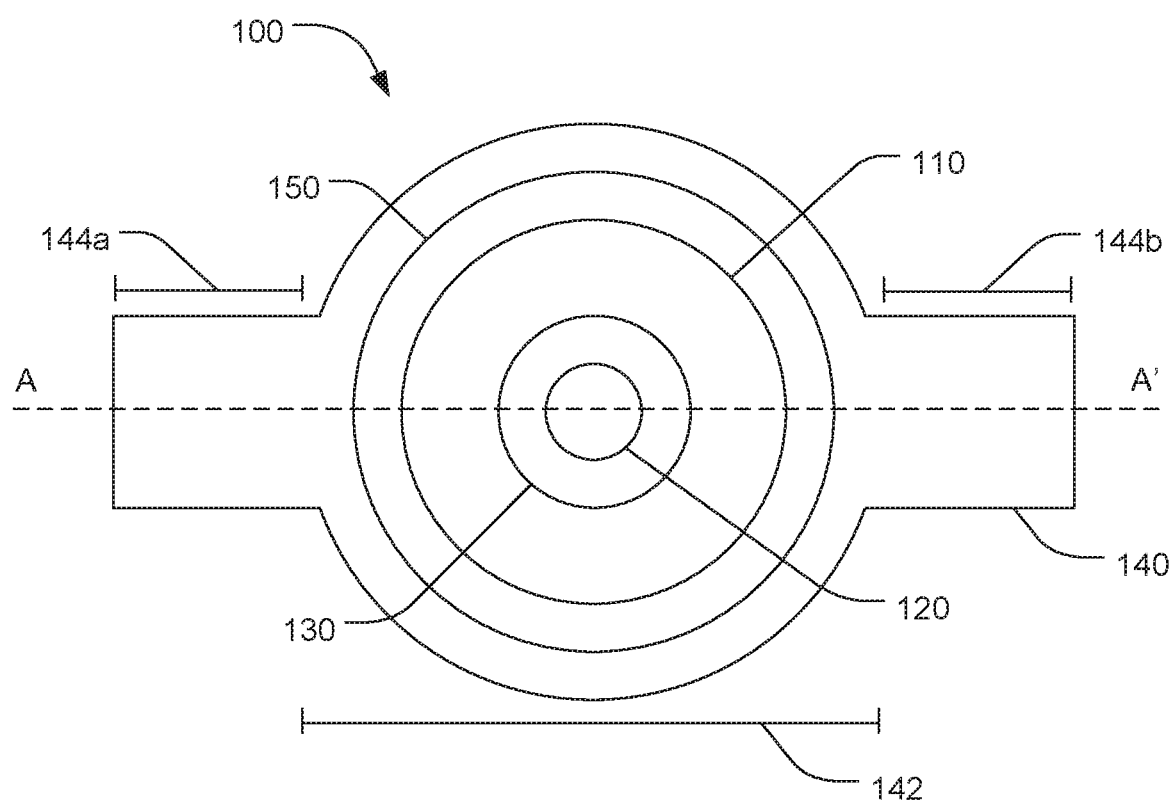
FIG. 1A illustrates a top view of a memory cell, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise and vice versa. Thus, for example, reference to "a memory cell" includes a plurality of such memory cells and reference to "bitlines" includes a single bitline.

In this application, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or elements are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

In traditional phase change memory (PCM) cells, different physical states of the PCM material can have different levels of electrical resistance. For example, one state, such as an amorphous state, can have a high electrical resistance, while another state, such as a crystalline state, can have a low electrical resistance. The different levels of electrical resistance between the amorphous and crystalline states can be used to store information (e.g. a plurality of memory states).

In some additional examples, chalcogenide-based memory cells can operate on a somewhat different principle of operation. For example, applying a positive or negative pulse at a particular voltage to the chalcogenide material can cause the threshold voltage of the chalcogenide material to change. In some cases, a particular programming pulse can produce a high voltage threshold state and an opposite polarity programming pulse can be used to produce a low voltage threshold state. The difference in voltage threshold between various states (e.g. a set state and a reset state, or vice versa) can be used to store different programmed states and can be defined as a programming window of the chalcogenide-based memory cell. This type of memory material or element can be referred to as a polarity-based memory material or element.

In either case, there is an increasing demand for higher density memory structures. However, actually achieving high density memory structures is not trivial. For example, in some cases, it can be challenging to achieve good component symmetry and structural integrity in higher density memory structures due to the complexity of the fabrication processes employed, the disparities in material characteristics for the various memory components formed, and the increasingly small sizes of individual memory components. The present disclosure describes memory cells, structures, devices, and systems, and associated methods of manufacturing, that can address these issues.

Additionally, in the present disclosure, it is noted that when discussing the various memory cells, structures, devices, systems, and methods, each of these discussions can be considered applicable to each of these examples, whether or not they are explicitly discussed in the context of that example. Thus, for example, in discussing details about the memory cells per se, such discussion also refers to the memory structures, memory devices, computing systems, and associated methods, and vice versa. Furthermore, discussion of a chalcogenide material refers to both the principle of phase change (e.g. amorphous and crystalline structures) as well as to movement and concentration of ions in the material and further to other chemical or physical properties or behavior that can be advantageously utilized for specific purposes under a given set of conditions.

Figure 1B:
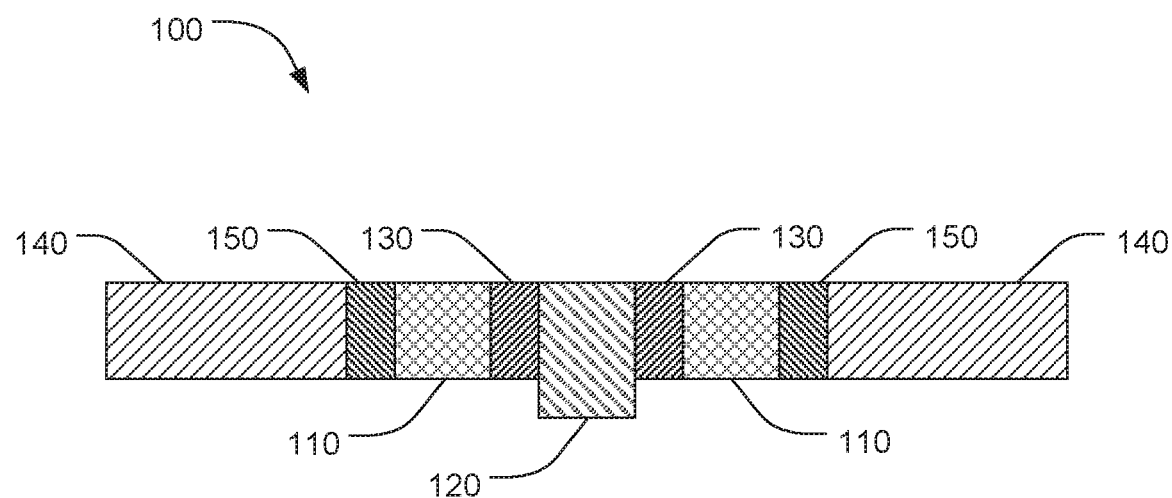
FIG. 1B illustrates a cross-sectional view along line A-A' of the memory cell illustrated in FIG. 1A, in accordance with an example embodiment.

In further detail, memory cells can include a chalcogenide material configured in an annular shape or a chalcogenide material configured to substantially circumscribe an interior conductive material. One example of a memory cell 100 is illustrated in FIGS. 1A-1B. It is noted that FIG. 1B illustrates a cross-sectional view along line A-A' of the memory cell 100 illustrated in FIG. 1A.

As previously discussed, the memory cell 100 includes a chalcogenide material 110 configured in an annular shape. A variety shapes can be considered annular with respect to the present disclosure. For example, annular shapes can include circular, elliptical, polygonal, or other suitable shapes that resemble or approach an annular shape. In some examples, the chalcogenide material may not have an annular shape, but can merely substantially circumscribe an interior conductive material 120. In still further examples, the chalcogenide material may not substantially circumscribe the interior conductive material 120. Where this is the case, the chalcogenide material can be disposed on opposite sides of the interior conductive material 120, or otherwise disposed about the interior conductive material 120 to maintain functionality of the memory cell 100.

A variety of chalcogenide materials can be used in the memory cells described herein. In some examples, the chalcogenide material can include germanium, antimony, tellurium, silicon, nickel, gallium, arsenic, silver, tin, gold, lead, bismuth, indium, selenium, oxygen, sulphur, nitrogen, carbon, yttrium, scandium, the like, or a combination thereof. In some examples, the chalcogenide material can include at least one of selenium (Se), arsenic (As), tellurium (Te), silicon (Si), germanium (Ge), yttrium (Y), indium (In), scandium (Sc), antimony (Sb), or the like. In some additional examples, the chalcogenide material can include Te and/or Se. In some examples, the chalcogenide material can include In, Y, Sc, or a combination thereof. In some specific examples, the chalcogenide material can include Si, Te, Se, As, Ge, or a combination thereof. In some examples, the chalcogenide material can include each of Si, Te, As, and Ge. In some other examples, the chalcogenide material can include each of Si, Se, As, and Ge. In some further examples, the chalcogenide material can include Si, Te, As, Ge, and In. In still other examples, the chalcogenide material can include Si, Te, As, Ge, and Y. In yet other examples, the chalcogenide material can include Si, Te, As, Ge, and P. In additional examples, the chalcogenide material can include Si, Se, As, Ge, and In. In other examples, the chalcogenide material can include Si, Se, As, Ge, and Y. In still other examples, the chalcogenide material can include Si, Se, As, Ge, and P. In some further examples, the chalcogenide material can be a chalcogenide glass or an amorphous chalcogenide material. In yet some additional examples, the chalcogenide material can be configured as polarity-based memory element. Thus, in some examples, the memory cells described herein can be polarity-based memory cells. In other examples, the chalcogenide material can include Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, or the like. The hyphenated chemical composition notation, as used herein, indicates the elements included in a particular mixture or compound, e.g., chalcogenide alloy, and is intended to represent all stoichiometries involving the indicated elements, e.g., $Ge_XSb_YTe_Z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient. In some additional examples, the chalcogenide alloy can be doped, such as with indium, yttrium, scandium, boron, nitrogen, oxygen, the like, or a combination thereof.

As described above, in some examples, the chalcogenide material 110 can substantially circumscribe an interior conductive material 120. In some additional examples, the interior conductive material 120 can extend above and/or below the chalcogenide material 110 to form an interior conductive channel. In some specific examples, the interior conductive material 120 can be configured as a wordline.

The interior conductive material can include a variety of suitable materials. Generally, the interior conductive material can include any material having an electrical resistance of less than 100 μOhm-cm that is suitable for use in the methods of manufacturing described herein. In some examples, the interior conductive material can include copper (Cu), carbon (C), tungsten (W), tungsten carbide (WC), graphene, diamond-like carbon (DLC); aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium (Ru), ruthenium nitride (RuN), the like, or a combination thereof. In some specific examples, the interior conductive material can include W.

In some additional examples, an interior electrode material 130 can be positioned between the chalcogenide material 110 and the interior conductive material 120. In some examples, the interior electrode material 130 can substantially circumscribe the interior conductive material 120. In some further examples, the interior electrode material 130 can be configured in an annular shape.

The interior electrode material can generally include any suitable material that is a good electrical conductor and that can minimize or prevent cross-contamination between the chalcogenide material and the interior conductive material. Typically, the interior electrode material can have an electrical resistance of from about 100 μOhm-cm to about 10 mOhm-cm. In some examples, the interior electrode material can include one or more conductive or semiconductive materials. Non-limiting examples can include carbon (C), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof.

Memory cell 100 can also include an exterior conductive material 140. In some examples, the exterior conductive material 140 can substantially circumscribe the chalcogenide material 110. In some further examples, a portion 142 of the exterior conductive material 140 can be configured in an annular shape. In yet further examples, the exterior conductive material 140 can also include oppositely disposed protruding portions 144a, 144b extending outwardly in opposite directions from the annular portion 142 of the exterior conductive material 140. In some specific examples, the exterior conductive material 140 can be configured as an exterior conductive channel. In some additional specific examples, the exterior conductive material 140 can be configured as a bitline.

The exterior conductive material can include a variety of suitable materials. Generally, the exterior conductive material can include any material having an electrical resistance of less than 100 μOhm-cm that is suitable for use in the methods of manufacturing described herein. In some examples, the exterior conductive material can include copper (Cu), carbon (C), tungsten (W), tungsten carbide (WC), graphene, diamond-like carbon (DLC); aluminum (Al), aluminum copper alloy (AlCu), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), ruthenium (Ru), ruthenium nitride (RuN), the like, or a combination thereof. In some specific examples, the exterior conductive material can include W.

In some further examples, memory cell 100 can include an exterior electrode material 150 between the exterior conductive material 140 and the chalcogenide material 110. In some examples, the exterior electrode material 150 can substantially circumscribe the chalcogenide material 110. In some further examples, the exterior electrode material 150 can be configured in an annular shape.

The exterior electrode material can generally include any suitable material that is a good electrical conductor and that can minimize or prevent cross-contamination between the chalcogenide material and the exterior conductive material. Typically, the exterior electrode material can have an electrical resistance of from about 100 μOhm-cm to about 10 mOhm-cm. In some examples, the exterior electrode material can include one or more conductive or semiconductive materials. Non-limiting examples can include carbon (C), carbon nitride ($C_xN_y$), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicides nitrides (e.g. TiSiN and WSiN, for example), conductive metal carbide nitrides (e.g. TiCN and WCN, for example), conductive metal oxides (e.g. $RuO_2$, for example), the like, or a combination thereof.

While not expressly illustrated in FIGS. 1A-1B for the sake of brevity and clarity, memory cell 100 can include a variety of additional materials. For example, in some cases, a lamina material can be positioned between the chalcogenide material and the interior electrode material, between the chalcogenide material and the exterior electrode material, or both. The lamina material can facilitate good adhesion between the chalcogenide material and surrounding electrode materials or can otherwise facilitate a good electrical connection between the chalcogenide material and surrounding electrode materials. The lamina material can include a variety of materials. Non-limiting examples can include tungsten, tantalum, titanium, other refractory metals, refractory metal nitrides, refractory metal silicides, refractory metal carbides, refractory metal borides, metal oxides, the like, or a combination thereof. Other suitable materials can also optionally be included in the memory cells described herein, such as select device (SD) materials (which can generally include the same material types as described with reference to the chalcogenide materials), additional electrode materials, other suitable materials, or a combination thereof.

As can be seen in FIGS. 1A-1B, memory cell 100 has a planar architecture and is oriented in a common layer around interior conductive material 120. This can facilitate fabrication of multiple decks having good electrical symmetry. Further, because each of the memory cell components can be formed in a common layer, the memory cell can also have good structural integrity.

Figure 2:
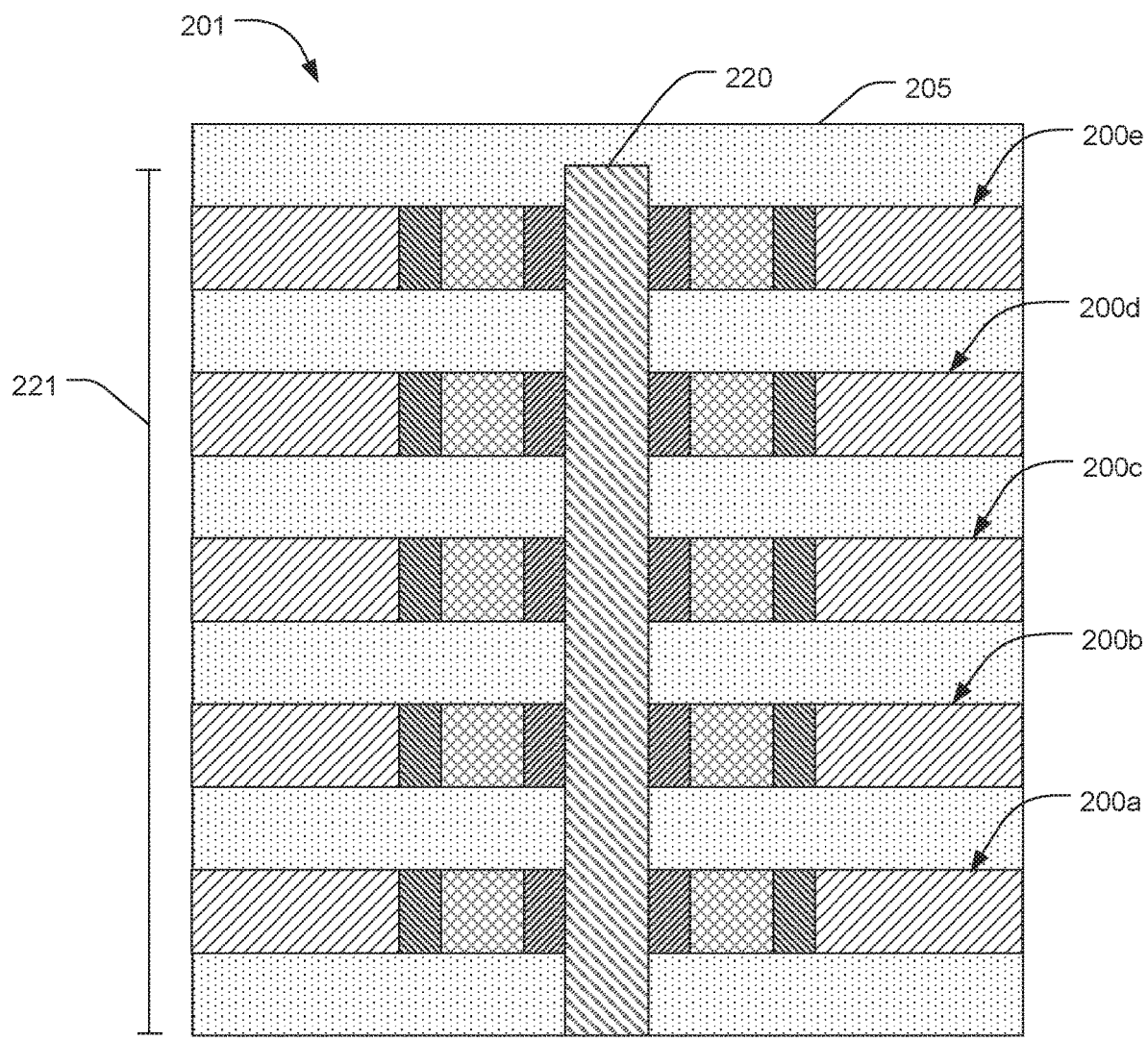
FIG. 2 illustrates a cross-sectional view of a memory structure, in accordance with and example embodiment.

For example, a memory structure 201 is illustrated in FIG. 2 having an interior conductive channel 220 and a plurality of alternating dielectric layers 205 and memory layers 200a-200e along the conductive channel. Each of the memory layers 200a-200e can represent an individual memory cell in memory structure 201 that substantially circumscribes the conductive channel 220 at different positions along a height or length 221 thereof. For example, individual memory layers 200a-200e can generally include the same features as described with respect to memory cell 100 illustrated in FIGS. 1A-1B or other memory cells described herein. Thus, 200a can represent a first level memory cell in a first memory layer, 200b can represent second level memory cell in a second memory layer, 200c can represent a third level memory cell in a third memory layer, 200d can represent a fourth level memory cell in a fourth memory layer, 200e can represent a fifth level memory cell in a fifth memory layer, etc. Although not expressly represented in FIG. 2, any suitable number of memory layers can be included in individual memory structures 201. As can be seen in FIG. 2, the memory structure 201 can have a high degree of symmetry due to the planar architecture of the individual memory layers 200a-200e.

The individual memory layers can be formed between dielectric layers 205 to electrically isolate individual memory layers. A variety of suitable dielectric materials can be used to form these insulating dielectric layers. Non-limiting examples can include silicon oxide, silicon nitride, silicon oxynitride, silicon carbide, undoped silicon, the like, or a combination thereof.

Figure 3A:
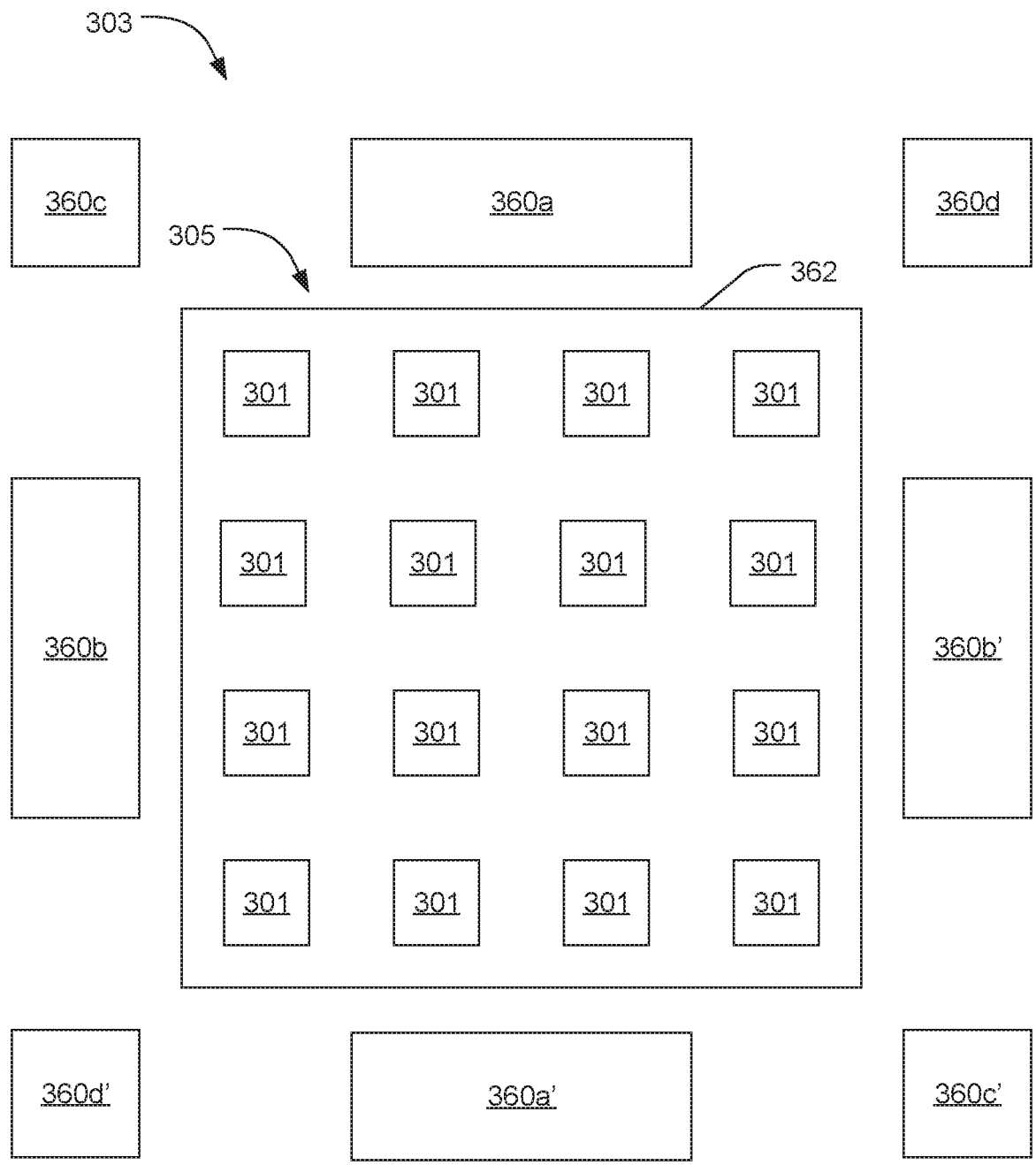
FIG. 3A illustrates a memory device, in accordance with an example embodiment.

Further, as illustrated in FIG. 3A, a plurality of memory structures 301 can be arranged in columns and rows on a substrate 362 to form a memory array 305 of a memory device 303. Individual memory structures 301 can generally include the same features as described with respect to memory structure 201 illustrated in FIG. 2 or other memory structures described herein. For example, individual memory structures 301 can include an interior conductive channel and alternating dielectric layers and memory layers (See FIG. 2, for example) positioned along a length or height thereof.

In further detail, the memory device 303 can include an array of memory structures, or memory cells where only a single memory layer is employed. Individual memory cells or memory structures can be electrically coupled to respective interior conductive channels (e.g. a single interior conductive channel associated with each respective memory structure 301, or memory cell where only a single memory layer is employed). With respect to FIG. 3A, individual interior conductive channels are oriented in a direction extending into and out of the page (See FIG. 1A, for example). A plurality of memory cells can be oriented along a length or height of individual interior conductive channels (See FIG. 2, for example). Thus, individual memory structures 301 can include a first level memory cell (e.g. 201a, for example), a second level memory cell (e.g. 201b, for example), and as many other levels of memory cells as is suitable and desirable. Individual first level memory cells can be aligned across the memory array in a first memory layer, individual second level memory cells can be aligned across the memory array in a second memory layer, and so forth. Accordingly, individual first level memory cells can substantially circumscribe or otherwise electrically couple to individual interior conductive channels at the first memory layer, individual second level memory cells can substantially circumscribe or otherwise electrically couple to individual interior conductive channels at the second memory layer, and forth. In some examples, individual memory structures 301 can be electrically isolated by dielectric material.

An interior conductive channel decoder can be electrically coupled to individual interior conductive channels. In some specific examples, the interior conductive channel decoder can be configured as a wordline decoder. In some examples, the interior conductive channel decoder can be positioned beneath the memory array 305 and within the perimeter of the memory array 305. Thus, in some examples, the substrate 362 can include an interior conductive channel decoder, the interior conductive channel decoder can be placed beneath substrate 362, or feature 362 can represent an interior conductive channel decoder or set of decoders. It is noted that positioning the interior conductive channel decoder beneath the memory array 305 can help maximize economy of space for the memory device 303 design. This configuration is facilitated by the planar architecture of individual memory cells oriented along a length or height of individual interior conductive channels.

The memory device 303 can also include a first level decoder 360a electrically coupled to first level memory cells, a second level decoder 360b electrically coupled to second level memory cells, a third level decoder 360c electrically coupled to third level memory cells, a fourth level decoder 360d electrically coupled to fourth level memory cells, and so forth. In some examples, these decoders can be electrically coupled to the exterior conductive channel of individual memory cells. In other words, in some examples, these decoders can be exterior conductive channel decoders. In some specific examples, these decoders can be configured as bitline decoders.

In some further examples, as illustrated in FIG. 3A, the first level decoder 360a, the second level decoder 360b, the third level decoder 360c, the fourth level decoder 360d, etc. can be positioned exterior to and about a perimeter of the memory array 305. It is noted that the planar architecture of individual memory cells oriented along respective interior conductive channels can allow these decoders to be positioned about the perimeter of the memory array 305 while the interior conductive channel decoder(s) can be positioned within the perimeter and beneath the memory array 305 to maximize economy of space for the memory device 303.

In some specific examples, the first level decoder can include decoder components 360a, 360a', the second level decoder can include decoder components 360b, 360b', the third level decoder can include decoder components 360c, 360c', the fourth level decoder can include decoder components 360d, 360d', and so forth. In some further examples, the separate decoder components at each level (e.g. 360a, 360a') can be oppositely disposed about the perimeter of the memory array. This can allow individual decoder lines or electrical connections to be formed in a common direction across the memory array at each level. To further maximize economy of space for the memory device 303, first level decoder 360a, 360a' can electrically couple in a first direction to first level memory cells, second level decoder 360b, 360b' can electrically couple in a second direction to second level memory cells, and so forth up to four different directions, after which the pattern can be repeated. While it is possible to use more than four different directions of electrical coupling, it is considered that four different directions provide good utilization of space around the perimeter of the memory array 305 and an efficient manner by which individual memory cells can be intercepted by respective decoders. With this in mind, other suitable numbers of electrical coupling directions can be employed as desired.

Figure 3B:
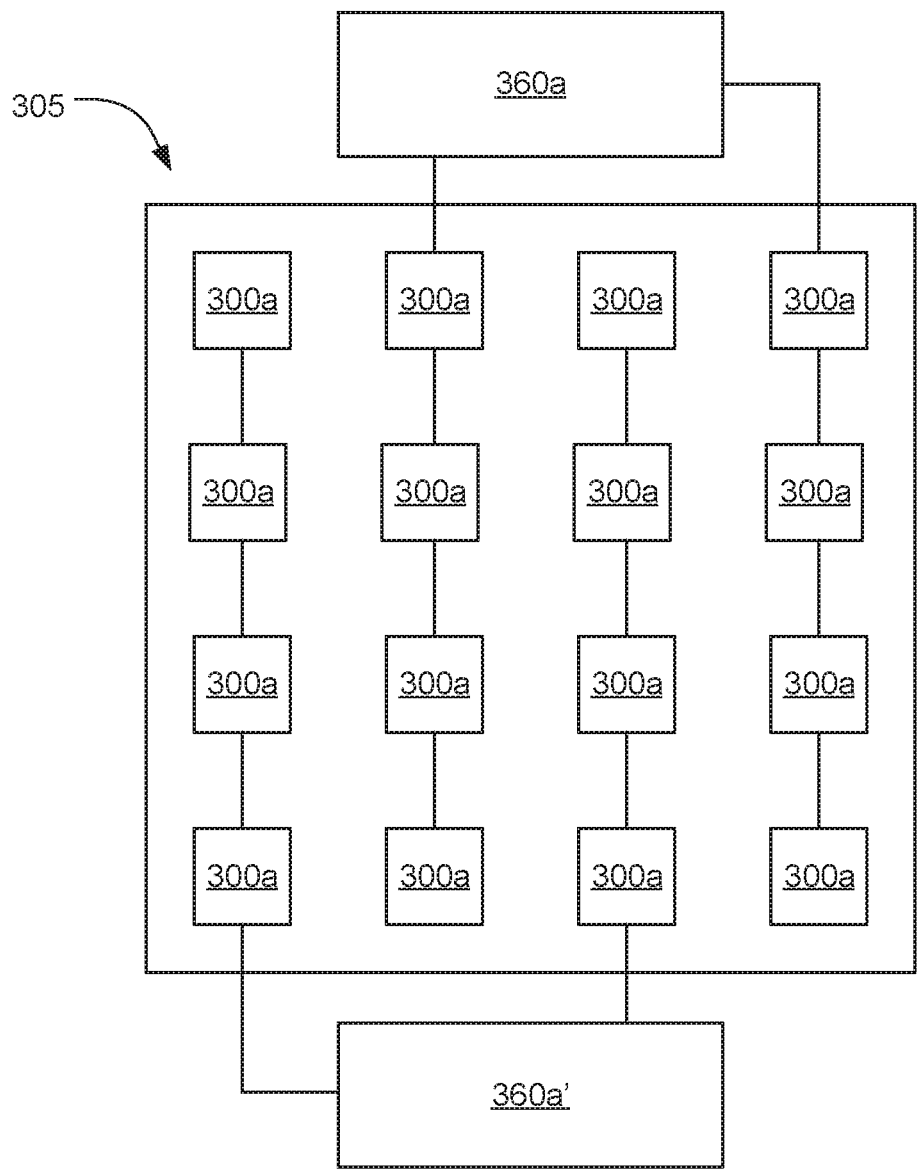
FIG. 3B illustrates a first level of the memory device of FIG. 3A, in accordance with an example embodiment.
Figure 3C:
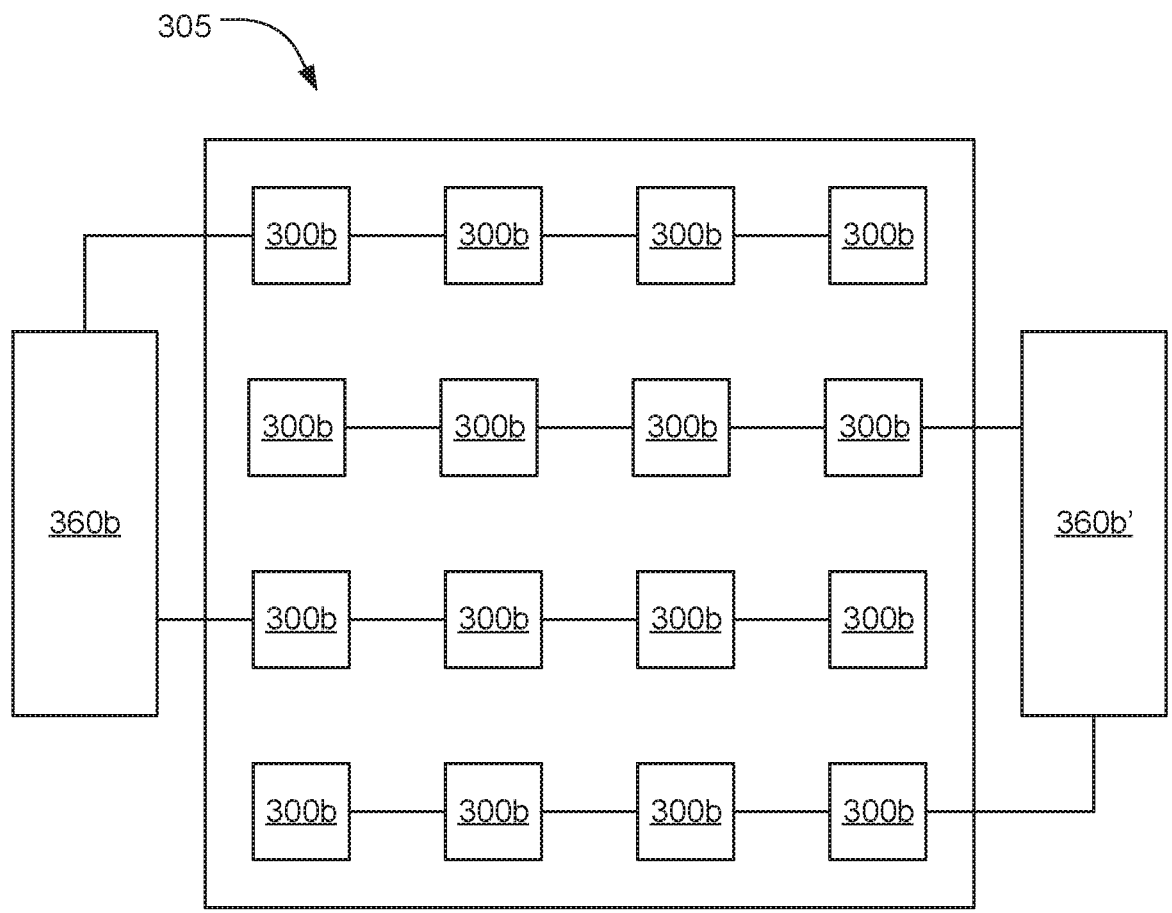
FIG. 3C illustrates a second level of the memory device of FIG. 3A, in accordance with an example embodiment.
Figure 3D:
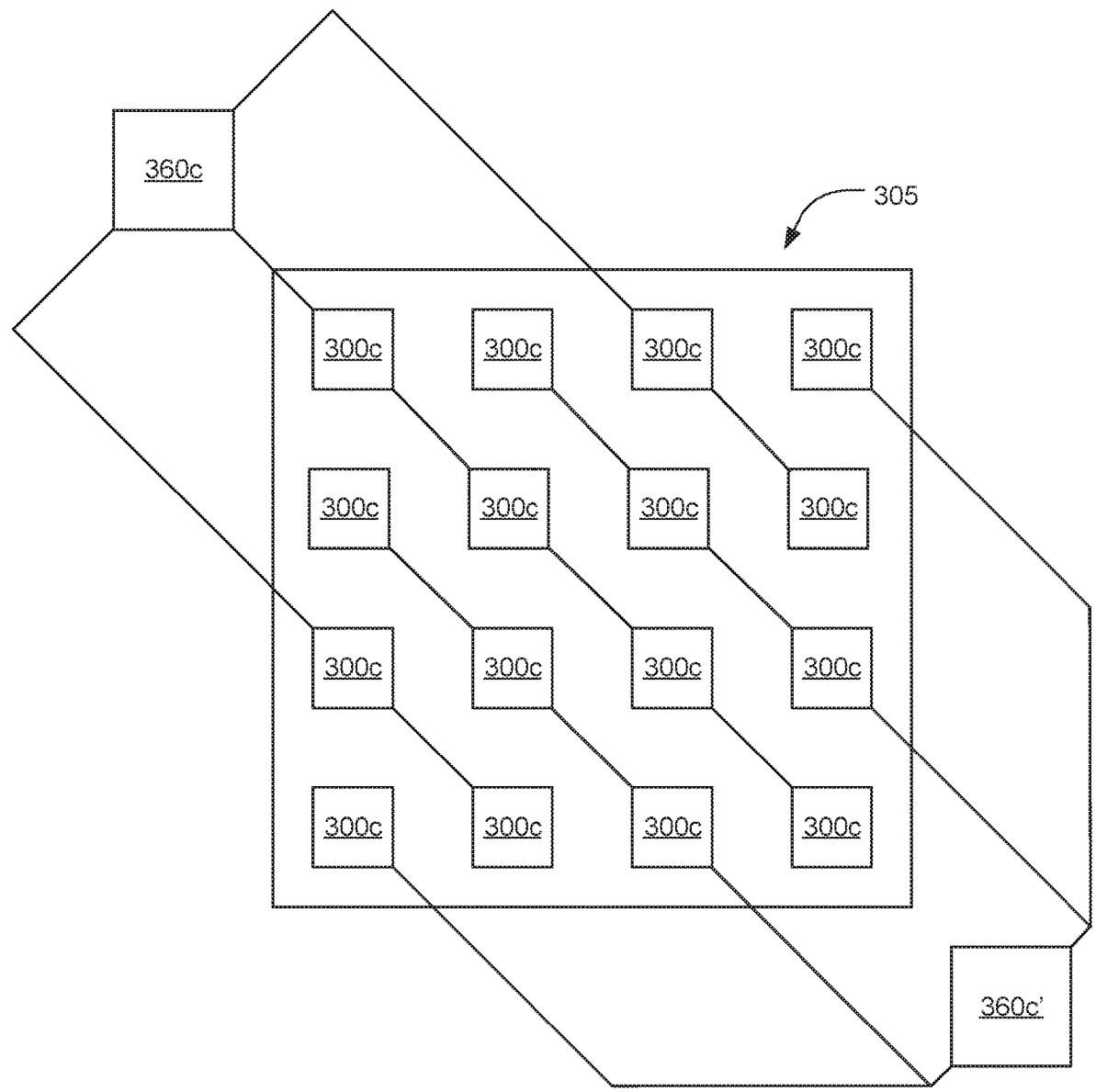
FIG. 3D illustrates a third level of the memory device of FIG. 3A, in accordance with an example embodiment.
Figure 3E:
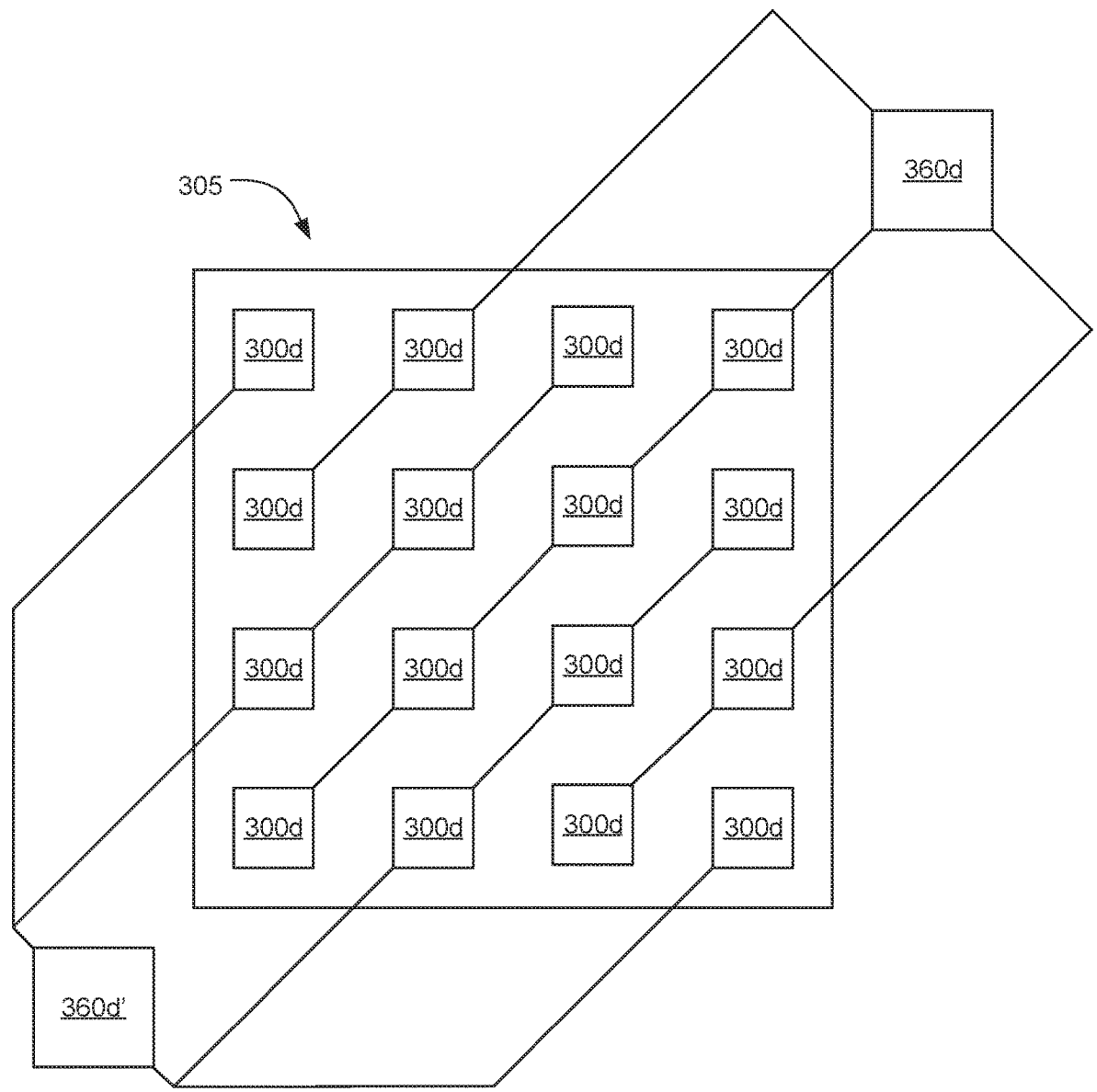
FIG. 3E illustrates a fourth level of the memory device of FIG. 3A, in accordance with an example embodiment.

This is further exemplified in FIGS. 3B-3E. For example, FIG. 3B illustrates a first level of memory cells 300a of memory array 305. First level decoder components 360a, 360a' can be electrically connected to individual first level memory cells 300a in a first direction. Similarly, FIG. 3C illustrates a second level of memory cells 300b of memory array 305. Second level decoder components 360b, 360b' can be electrically connected to individual second level memory cells 300b in a second direction, which, in this particular example, is transverse to the first direction. FIG. 3D illustrates a third level of memory cells 300c of memory array 305. Third level decoder components 360c, 360c' can be electrically connected to individual third level memory cells 300c in a third direction. Likewise, FIG. 3E illustrates a fourth level of memory cells 300d of memory array 305. Fourth level decoder components 360d, 360d' can be electrically connected to individual fourth level memory cells 300d in a fourth direction, which, in this particular example, is transverse to the third direction. The sequence can then be repeated beginning at the fifth level of memory cells. It is noted that the particular order of the sequence of electrical coupling directions illustrated in FIGS. 3B-3E is not required. Other suitable sequences of electrical coupling directions can also be employed.

Figure 3F:
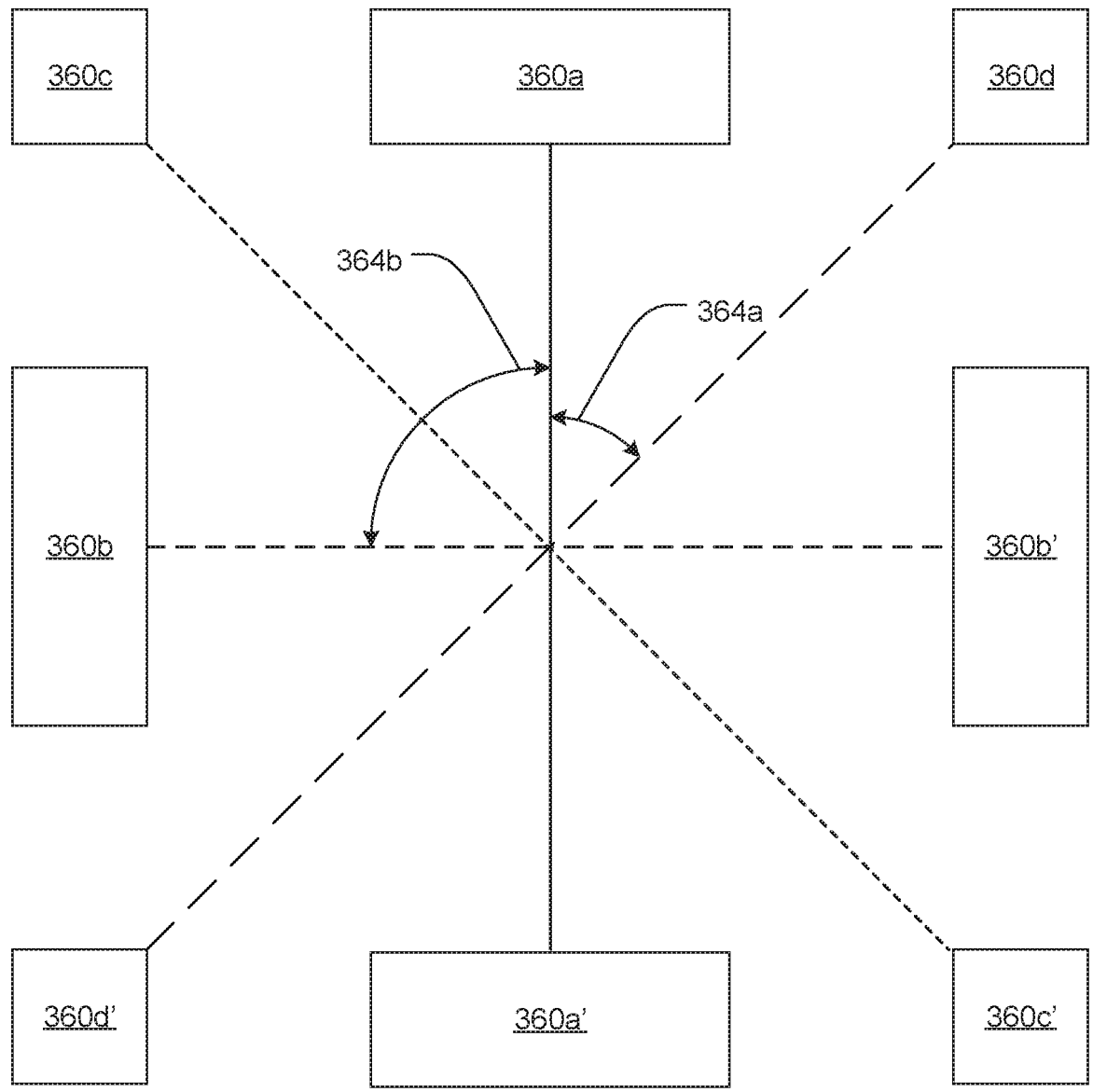
FIG. 3F illustrates the general directionality of the electrical connections between individual memory cells and corresponding decoders of the memory device of FIG. 3A, in accordance with an example embodiment.

FIG. 3F illustrates the general directionality of the electrical coupling patterns of individual decoders to memory cells at different levels of the memory array. As can be seen, some electrical coupling directions can be offset by a first angle 364a. First angle 364a can generally be an angle of from about 40° to about 50°, from about 42° to about 48°, or about 45°. Some other coupling directions can be offset by a second angle 364b. Second angle 364b can generally be an angle of from about 80° to about 100°, from about 85° to about 95°, or about 90°. It is to be understood that when measuring angles between different electrical coupling directions, the angles refer to the smallest angles between individual electrical coupling directions.

Figure 4:
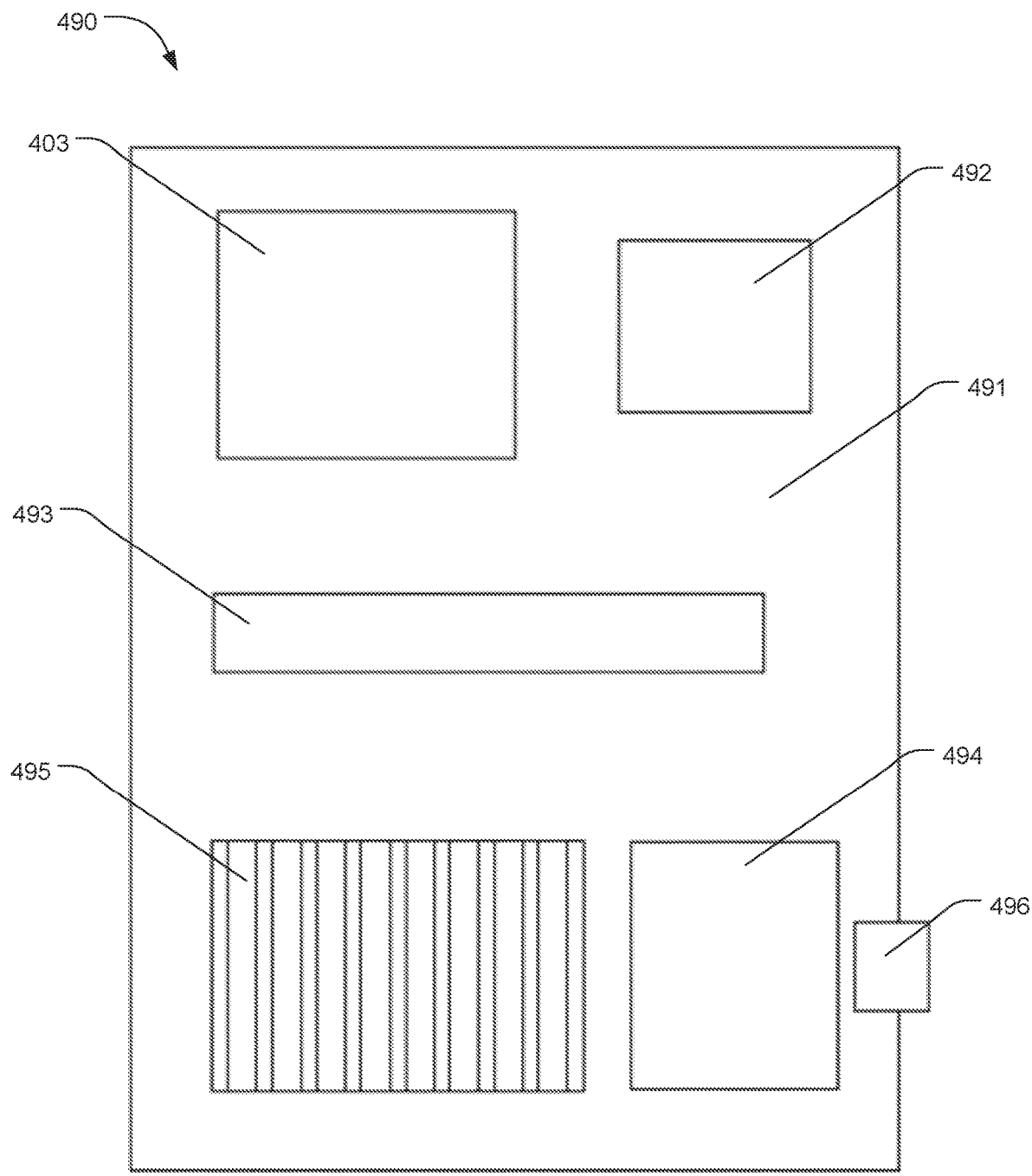
FIG. 4 illustrates a plan view of a computing system, in accordance with and example embodiment.

In some examples, a memory device as described herein can be included in a computing system. In one aspect, as illustrated in FIG. 4, a computing system 490 can include a motherboard 491 and a memory device 403 as described herein that is operably coupled to the motherboard 491. In some additional examples, a computing system 490 can include a processor 492, a radio 494, a heat sink 495, a port 496, a slot 493, an additional memory device (not shown), or any other suitable device or component, which can be operably coupled to the motherboard 491. The computing system 490 can comprise any type of computing system, such as a desktop computer, a laptop computer, a tablet computer, a smartphone, a wearable device, a server (e.g. a local data storage server, a cloud storage server, or the like), etc. Other embodiments need not include all of the features specified in FIG. 4, and may include alternative features not specified in FIG. 4.

Circuitry used in electronic components or devices (e.g. a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

The present disclosure also describes various methods of manufacturing a memory structure. Generally, methods of manufacturing a memory structure can include forming a plurality of alternating dielectric layers and memory layers and forming an interior conductive channel through the plurality of alternating dielectric layers and memory layers. Individual memory layers can include a chalcogenide material substantially circumscribing the interior conductive channel, or otherwise electrically coupled to the interior conductive channel.

Figure 5A:
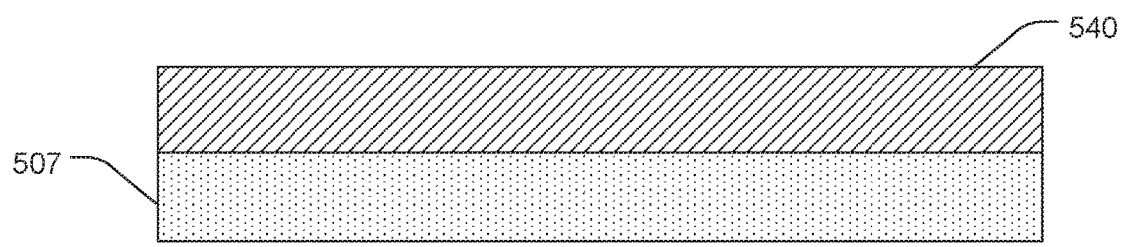
FIGS. 5A-5N are cross-sectional views of steps in a method of manufacturing a memory structure, in accordance with an example embodiment.
Figure 5B:
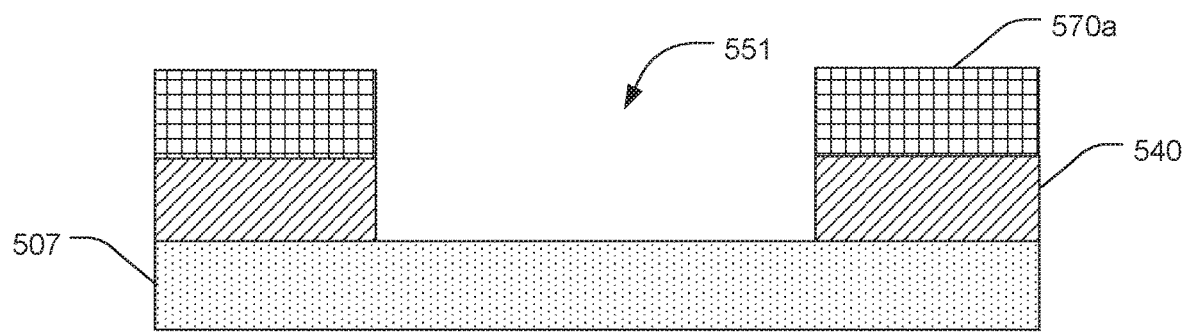
Figure 5C:
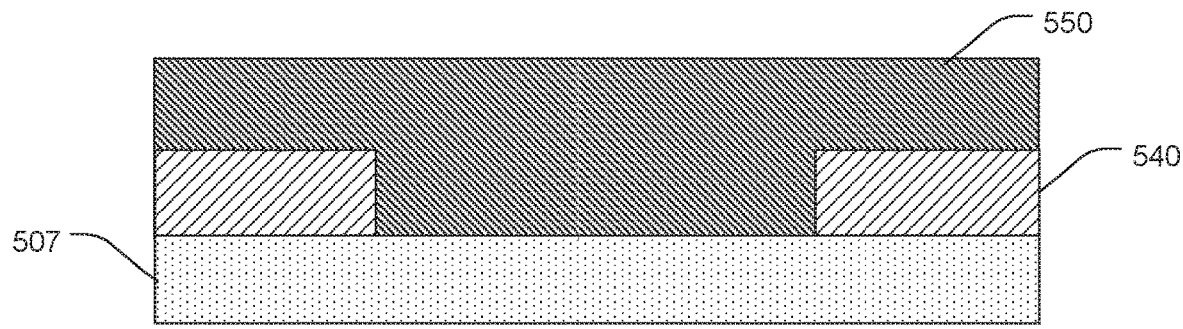
Figure 5D:
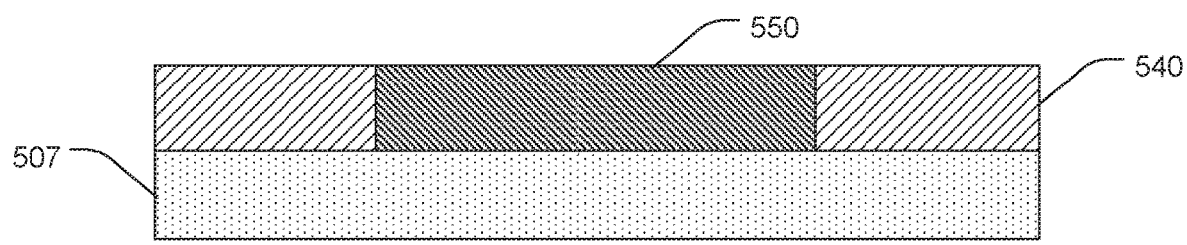
Figure 5E:
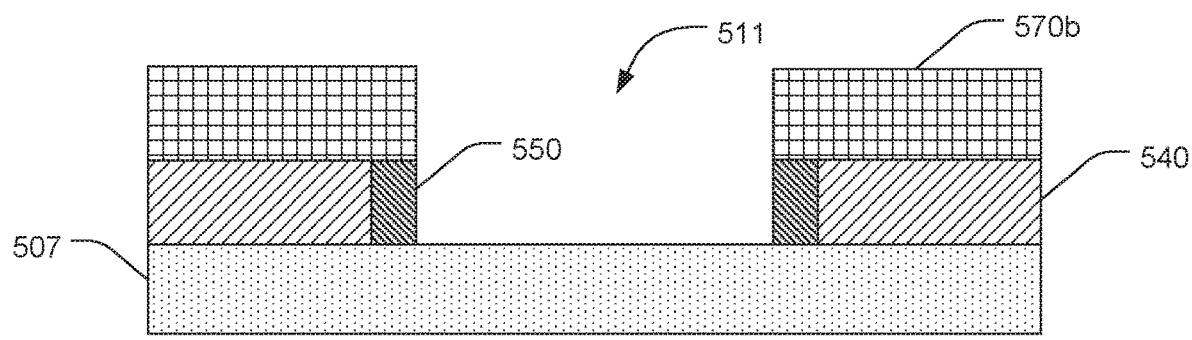
Figure 5F:
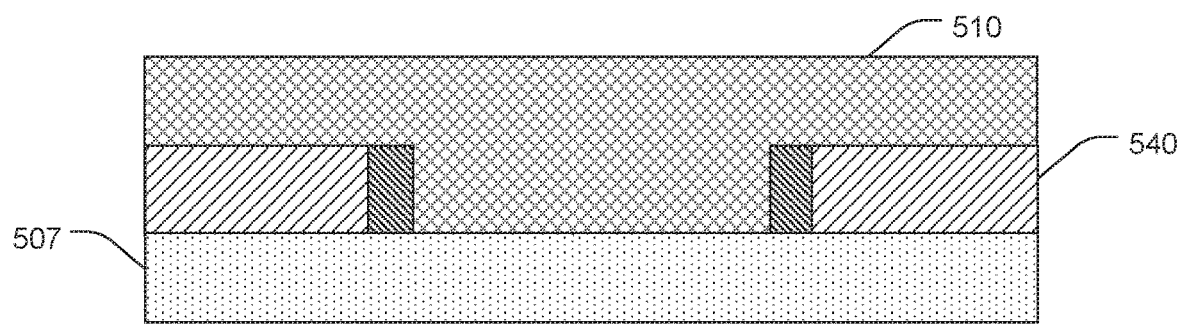
Figure 5G:
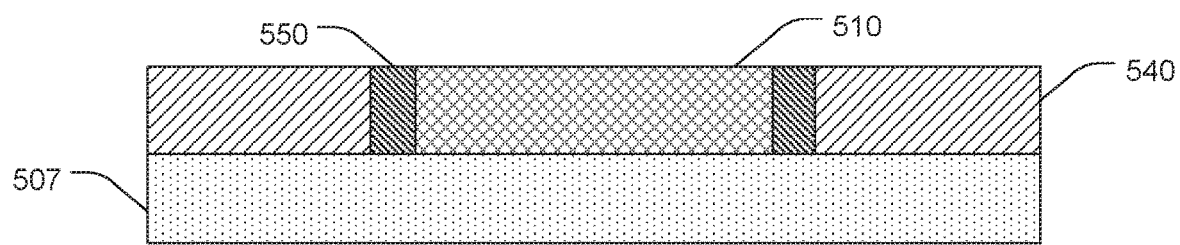
Figure 5H:
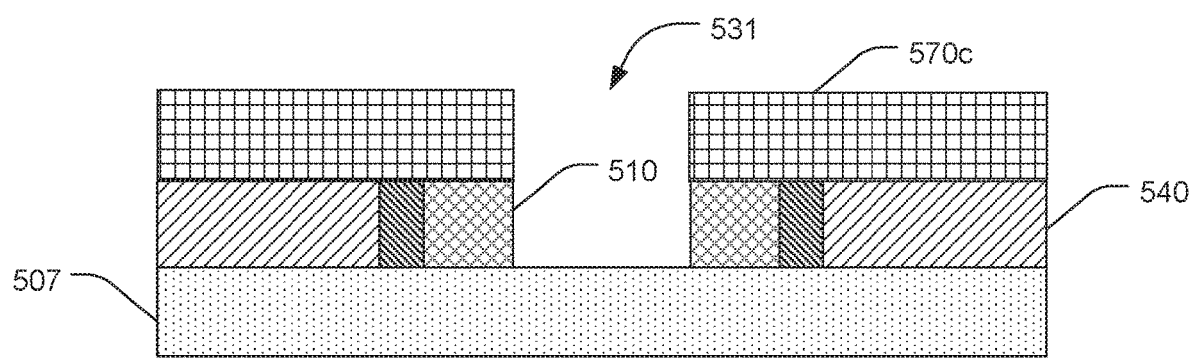
Figure 5I:
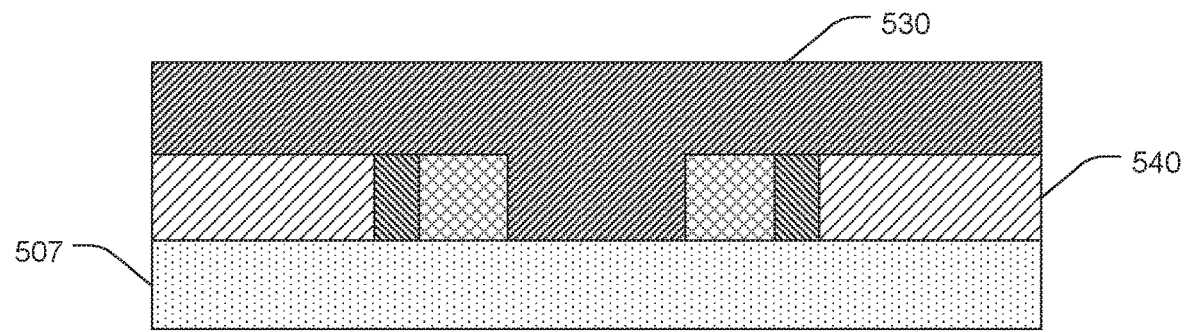
Figure 5J:
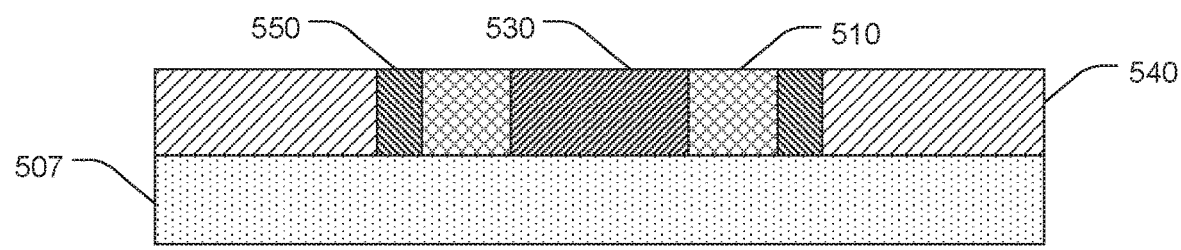
Figure 5K:
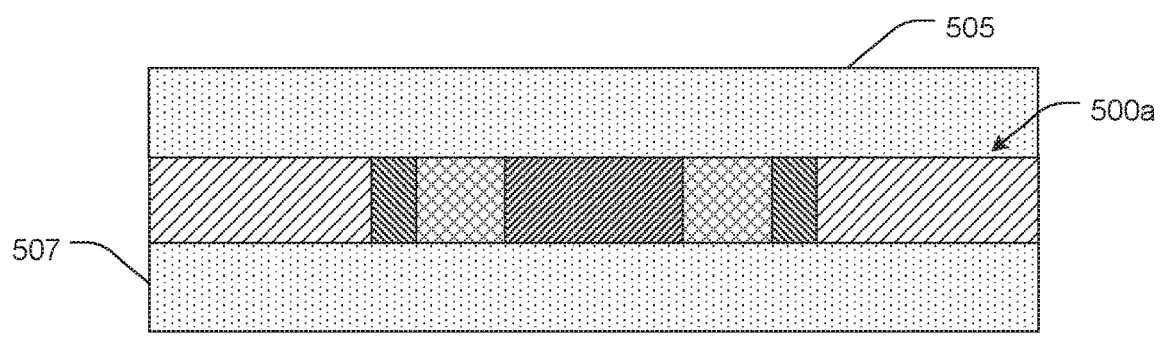
Figure 5L:
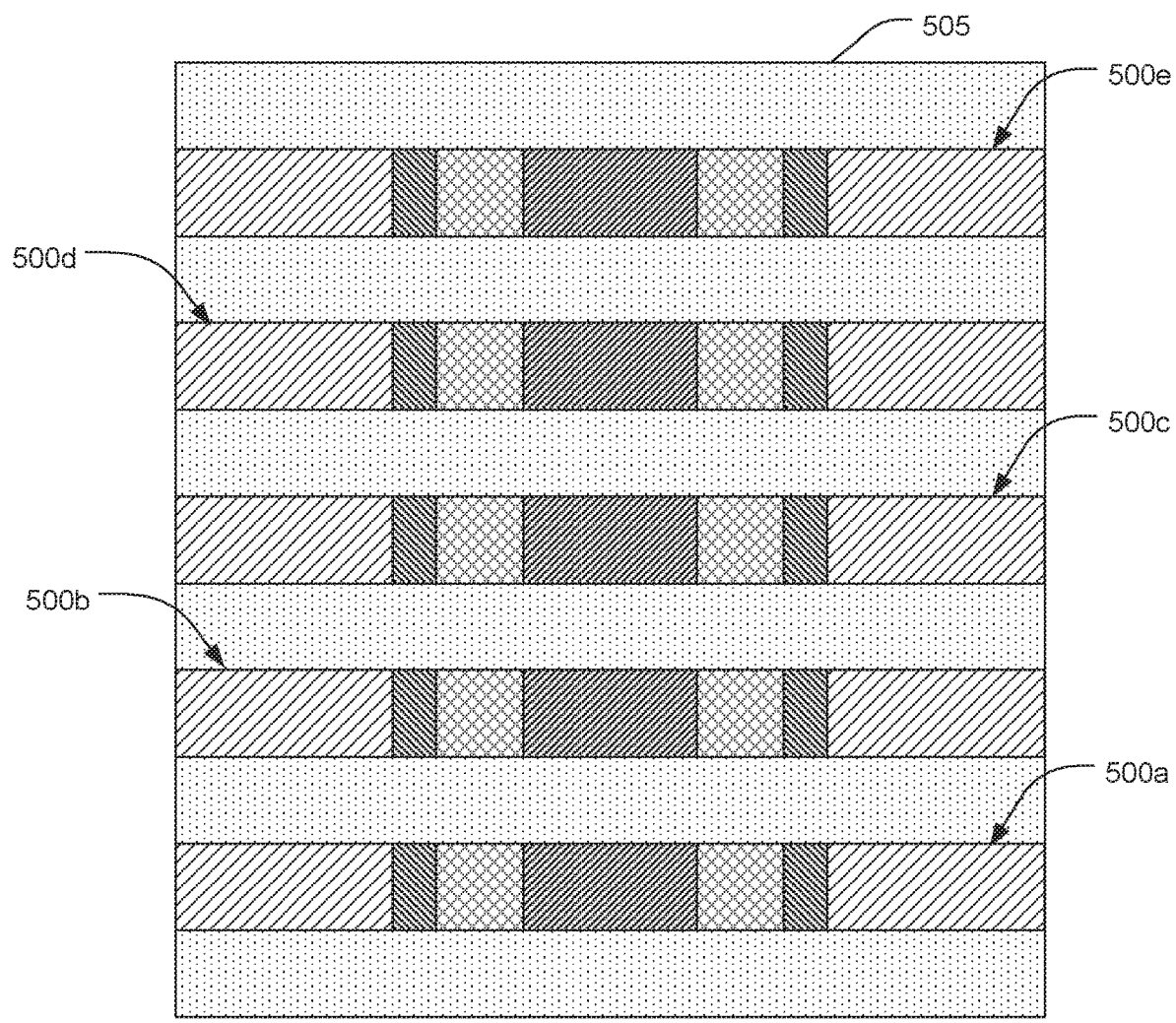
Figure 5M:
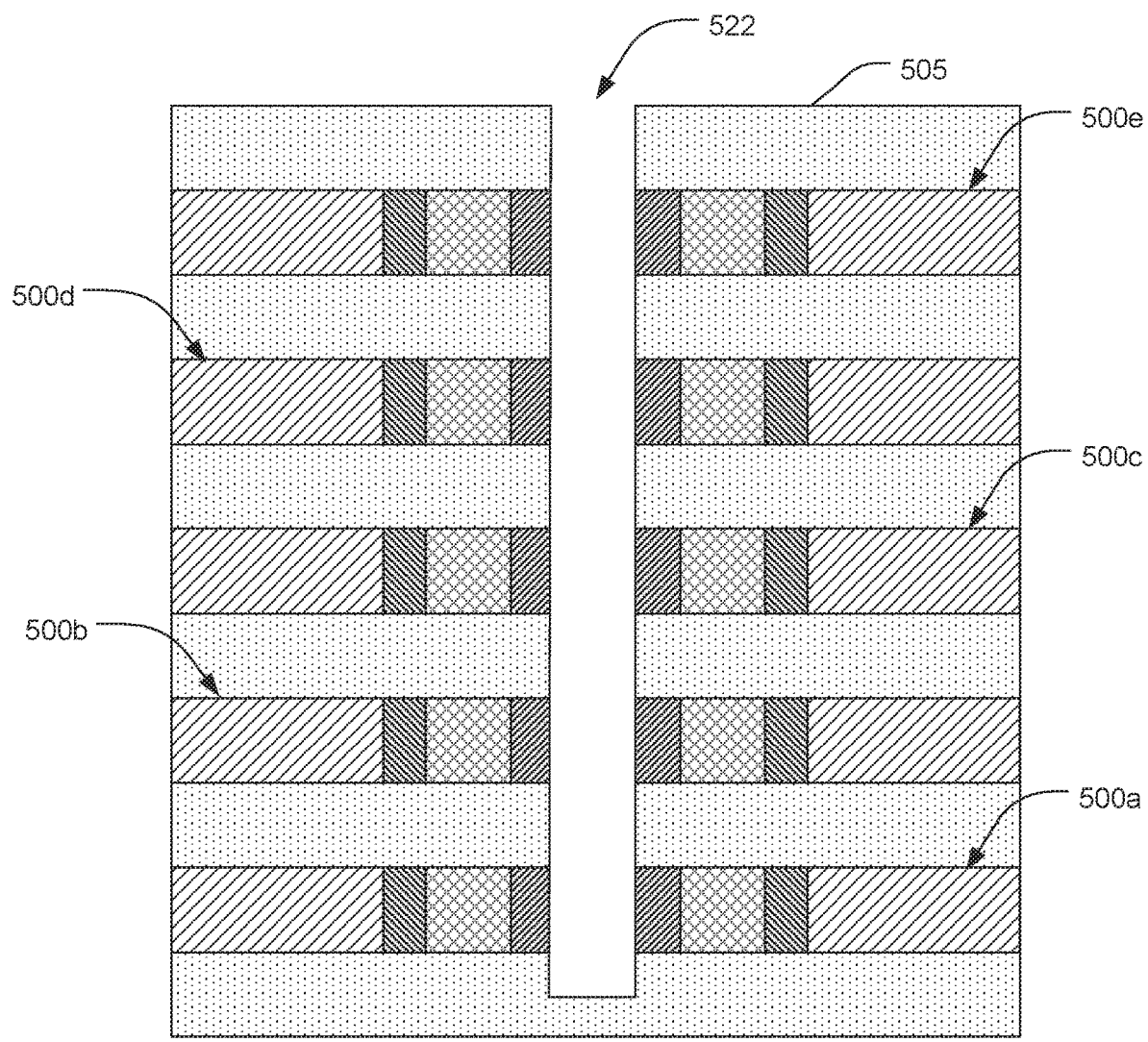
Figure 5N:
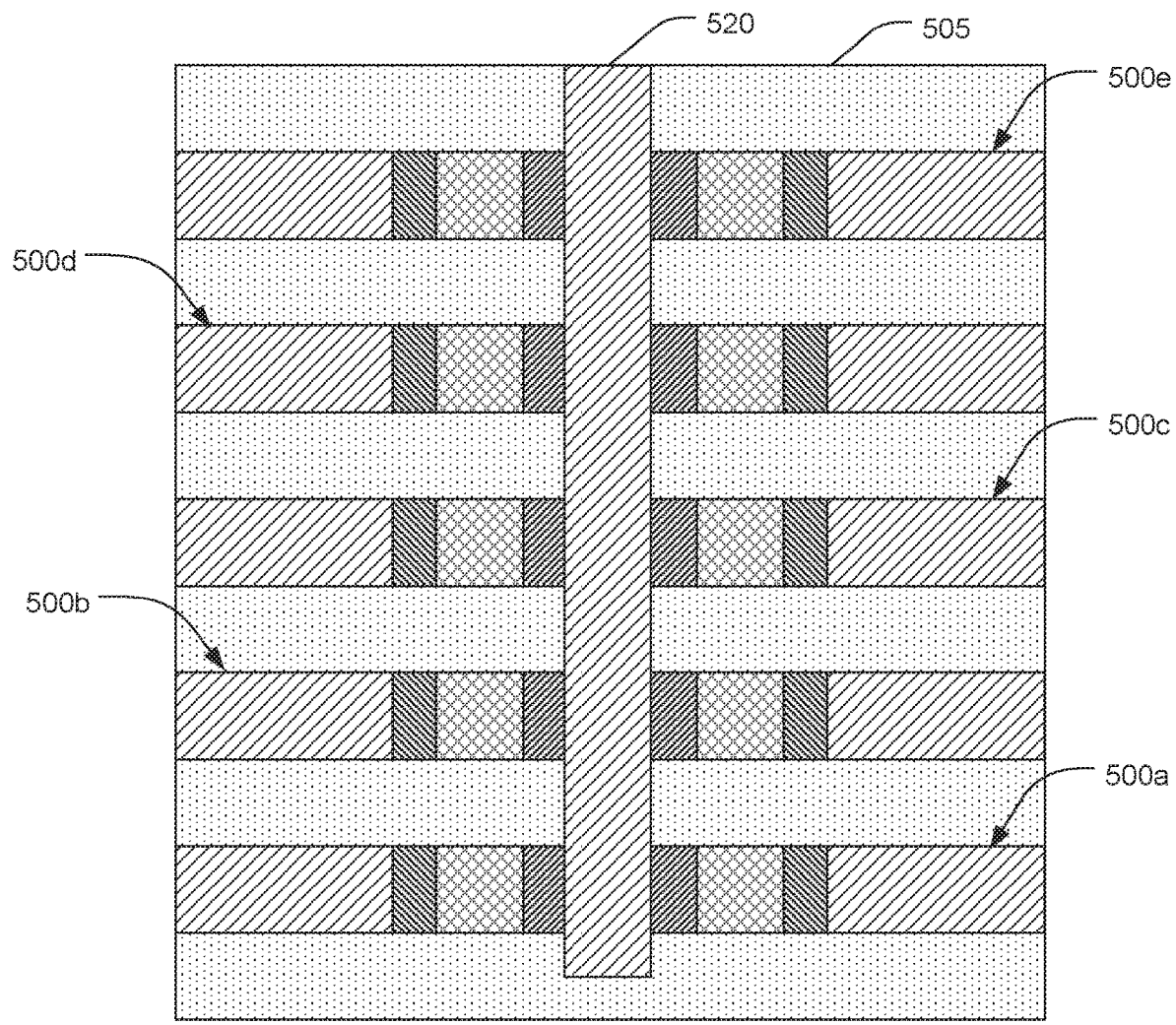

One example of a method of manufacturing a memory structure is illustrated in FIGS. 5A-5N. In further detail, FIG. 5A illustrates an exterior conductive material layer 540 formed on a substrate 507. The exterior conductive material layer 540 can be formed by chemical vapor deposition (CVD), physical vapor deposition (PVD), atomic layer deposition (ALD), or the like. The exterior conductive material layer can comprise a variety of suitable conductive materials, such as those described elsewhere herein with respect to the exterior conductive material. The thickness of the exterior conductive material layer, and subsequent materials, can be tailored to achieve a desired density for the memory cell.

As illustrated in FIG. 5B, a mask 570a can be used to pattern (e.g. using photolithography, for example) and remove a portion of the exterior conductive material layer to form an exterior electrode recess 551. The portion of the exterior conductive material layer can be removed using dry etching, wet etching, the like, or a combination thereof. The mask 570a can include silicon nitride or other material suitable for a complementary metal-oxide semiconductor (CMOS) process. Generally, each of the masks described herein can include the same types of materials, though it is not necessary to use the same material for each mask. In some specific examples, the same material can be used for each of the masks employed in a particular embodiment of the methods of manufacturing described herein.

Turning to FIG. 5C, the mask 570a can be removed and an exterior electrode material 550 can be formed in the exterior electrode recess 551. The exterior electrode material 550 can comprise a variety of suitable materials, such as those described elsewhere herein. The exterior electrode material 550 can be formed using CVD, PVD, ALD, or the like. As further illustrated in FIG. 5D, the exterior electrode material 550 can be planarized (e.g. using chemical mechanical planarization (CMP)) to remove excess material.

In some examples, the exterior conductive material layer 540 can substantially circumscribe the exterior electrode material 550.

As represented in FIG. 5E, a second mask 570b can be used to pattern (e.g. using photolithography, for example) the existing materials and remove a portion of the exterior electrode material 550 to form a chalcogenide recess 511. The portion of the exterior electrode material 550 can be removed using dry etching, wet etching, the like, or a combination thereof.

Turning to FIG. 5F, the second mask 570b can be removed and a chalcogenide material 510 can be formed in the chalcogenide recess 511. The chalcogenide material 510 can comprise a variety of suitable materials, such as those described elsewhere herein. The chalcogenide material 550 can be formed using CVD, PVD, ALD, or the like. As further illustrated in FIG. 5G, the chalcogenide material 550 can be planarized (e.g. using CMP) to remove excess chalcogenide material. In some examples, the exterior electrode material 550 can substantially circumscribe the chalcogenide material 510.

As represented in FIG. 5H, a third mask 570c can be used to pattern (e.g. using photolithography, for example) the existing materials and remove a portion of the chalcogenide material 510 to form an interior electrode recess 531. The portion of the chalcogenide material 510 can be removed using dry etching, wet etching, the like, or a combination thereof.

Turning to FIG. 5I, the third mask 570c can be removed and an interior electrode material 530 can be formed in the interior electrode recess 531. The interior electrode material 530 can comprise a variety of suitable materials, such as those described elsewhere herein. The interior electrode material 530 can be formed using CVD, PVD, ALD, or the like. As further illustrated in FIG. 5J, the interior electrode material 530 can be planarized (e.g. using CMP) to remove excess material. In some examples, the chalcogenide material layer 510 can substantially circumscribe the interior electrode material 530. FIG. 5J can generally represent a memory layer, having an exterior conductive material 540, an exterior electrode material 550, a chalcogenide material 510, and an interior electrode material 530, formed on a substrate 507.

As represented in FIG. 5K, a dielectric layer 505 can be formed on memory layer or first level memory cell 500a. A variety of suitable dielectric materials can be used to form dielectric layer 505, such as those described elsewhere herein. The dielectric layer 505 can be formed using CVD, PVD, ALD, or the like. Dielectric layer 505 can then become the substrate for the next memory layer and the process can be repeated to achieve a suitable and desirable number of memory layers or levels of memory cells.

For example, FIG. 5L illustrates a pre-cursor memory structure including a plurality of memory layers 500a-500e individually positioned between dielectric layers 505. As illustrated in FIG. 5M, an interior conductive channel trench 522 can be formed through the plurality of memory layers 500a-500e and dielectric layers 505. More specifically, the interior conductive channel trench 522 can be formed through the interior electrode material 530 of individual memory layers 500a-500e and adjacent dielectric material. Thus, removed portions of interior electrode material 530 from individual memory layers 500a-500e can form individual segments of the interior conductive channel trench 522. Further, in some examples, individual memory layers 500a-500e can be substantially symmetrical about the interior conductive channel trench 522. The interior conductive channel trench 522 can be formed using dry etching, wet etching, the like, or a combination thereof.

As illustrated in FIG. 5N, the interior conductive channel trench 522 can be filled in with interior conductive channel material to form an interior conductive channel 520. The interior conductive channel 520 can be formed of a variety of suitable materials, such as those described elsewhere herein. The interior conductive channel 520 can be formed by a variety of suitable processes, including CVD, PVD, and the like.

Figure 6A:
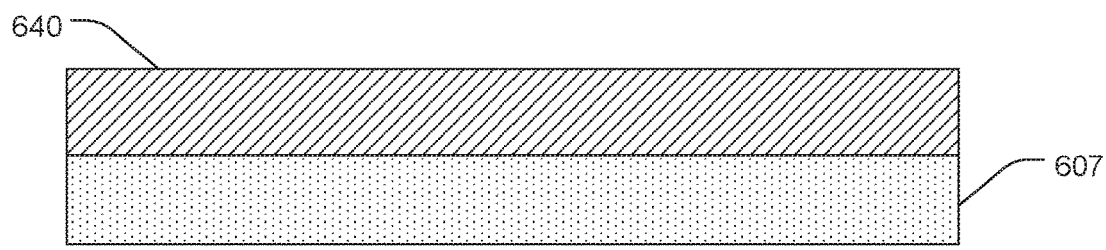
FIGS. 6A-6K are cross-sectional views of steps in another method of manufacturing a memory structure, in accordance with an example embodiment.

Another method of manufacturing a memory structure is illustrated in FIGS. 6A-6K. In further detail, FIG. 6A illustrates an exterior conductive material layer 640 formed on a substrate 607. The exterior conductive material layer 640 can be formed by CVD, PVD, ALD, or the like. The exterior conductive material layer 640 can comprise a variety of suitable conductive materials, such as those described elsewhere herein with respect to the exterior conductive material.

Figure 6B:
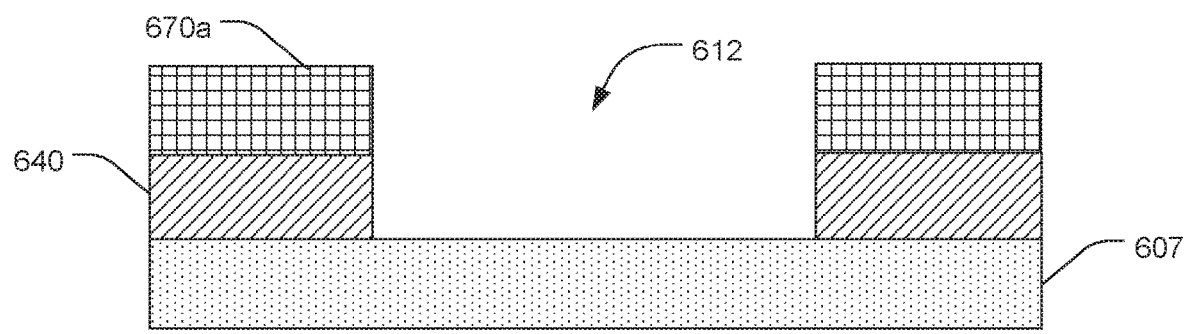

As illustrated in FIG. 6B, a mask 670a can be used to pattern (e.g. using photolithography, for example) and remove a portion of the exterior conductive material layer 640 to form a chalcogenide recess 612. The portion of the exterior conductive material layer 640 can be removed using dry etching, wet etching, the like, or a combination thereof.

Figure 6C:
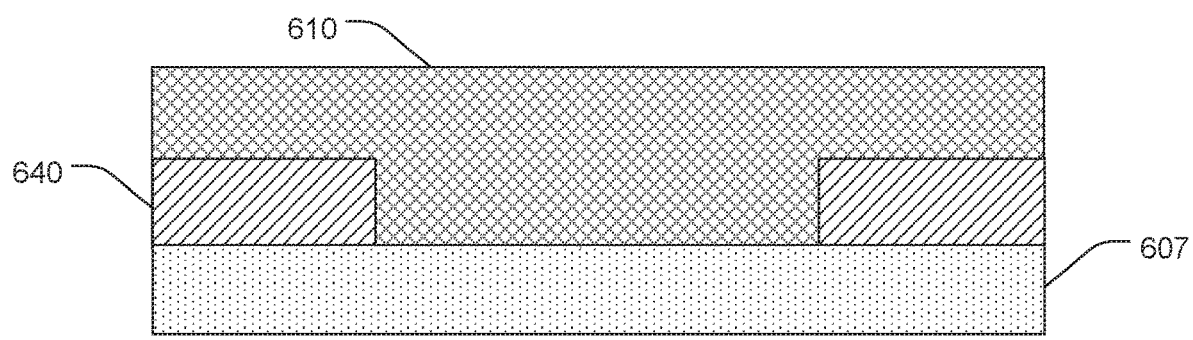
Figure 6D:
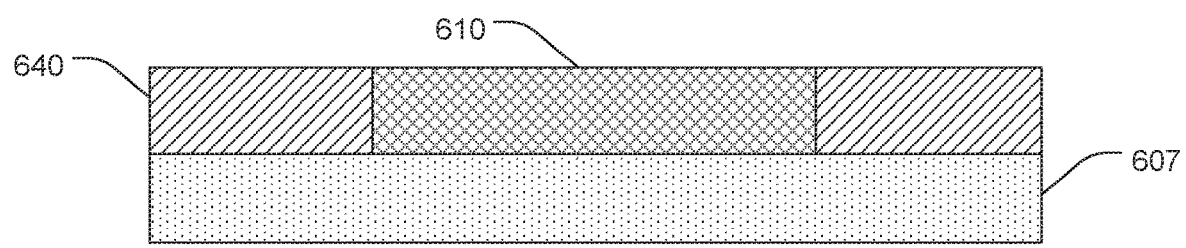

Turning to FIG. 6C, the mask 670a can be removed and a chalcogenide material 610 can be formed in the chalcogenide recess 512. The chalcogenide material 610 can comprise a variety of suitable materials, such as those described elsewhere herein. The chalcogenide material 610 can be formed using CVD, PVD, ALD, or the like. As further illustrated in FIG. 6D, the chalcogenide material 610 can be planarized (e.g. using CMP) to remove excess material. In some examples, the exterior conductive material layer 640 can substantially circumscribe the chalcogenide material 610.

Figure 6E:
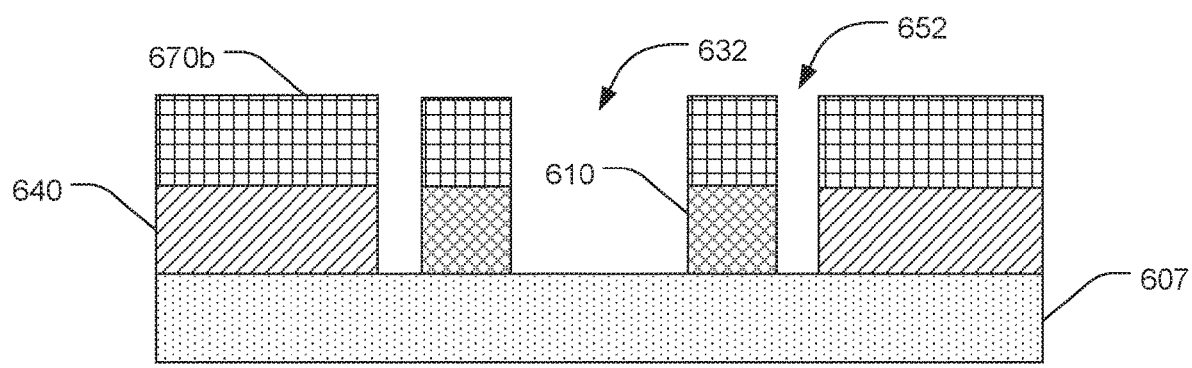

Turning to FIG. 6E, a second mask 670b can be used to pattern (e.g. using photolithography, for example) the existing materials and remove portions of the chalcogenide material 610 to form an exterior electrode recess 652 and a separate interior electrode recess 632. The portions of the chalcogenide material 610 can be removed using dry etching, wet etching, the like, or a combination thereof.

Figure 6F:
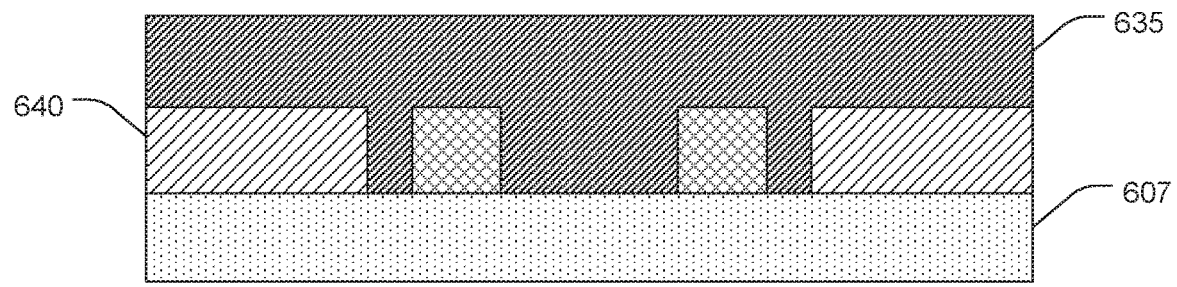
Figure 6G:
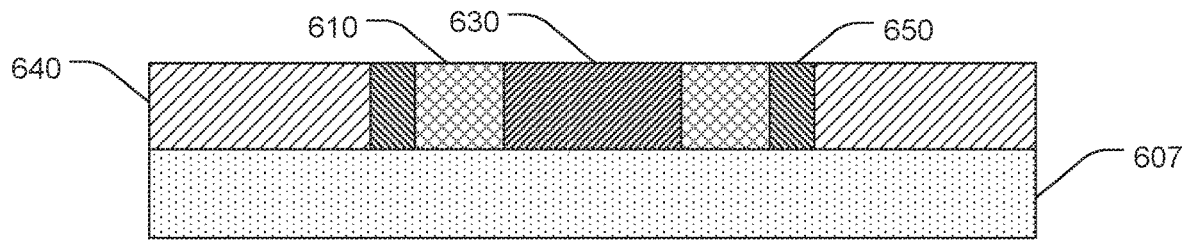

Turning to FIG. 6F, the second mask 670b can be removed and an electrode material 635 can be formed in the exterior electrode recess 652 and the separate interior electrode recess 632. Thus, in some examples, the exterior electrode material and the interior electrode material can be formed simultaneously or contemporaneously. The electrode material 635 can comprise a variety of suitable materials, such as those described elsewhere herein with respect to the exterior electrode materials and interior electrode materials. The electrode material 635 can be formed using CVD, PVD, ALD, or the like. As further illustrated in FIG. 6G, the electrode material 635 can be planarized (e.g. using CMP) to remove excess material and separate the exterior electrode material 650 and interior electrode material 630. In some examples, the exterior electrode material 650 can substantially circumscribe the chalcogenide material 610. In some additional examples, the chalcogenide material 610 can substantially circumscribe the interior electrode material 630. FIG. 6G can generally represent a memory layer, having an exterior conductive material 640, an exterior electrode material 650, a chalcogenide material 610, and an interior electrode material 630, formed on a substrate 507.

Further, the method illustrated in FIGS. 6A-6G can arrive at an equivalent structure as illustrated in FIG. 5J using one less mask.

Figure 6H:
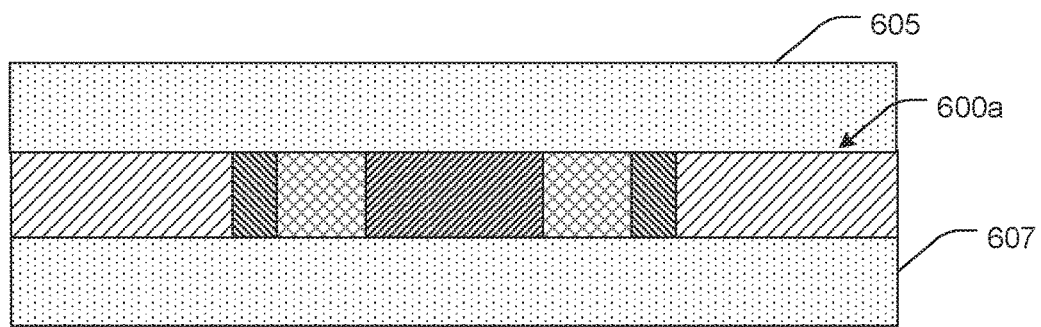

As represented in FIG. 6H, a dielectric layer 605 can be formed on memory layer or first level memory cell 600a. A variety of suitable dielectric materials can be used to form dielectric layer 605, such as those described elsewhere herein. The dielectric layer 605 can be formed using CVD, PVD, ALD, or the like. Dielectric layer 605 can then become the substrate for the next memory layer and the process can be repeated to achieve a suitable and desirable number of memory layers or levels of memory cells.

Figure 6I:
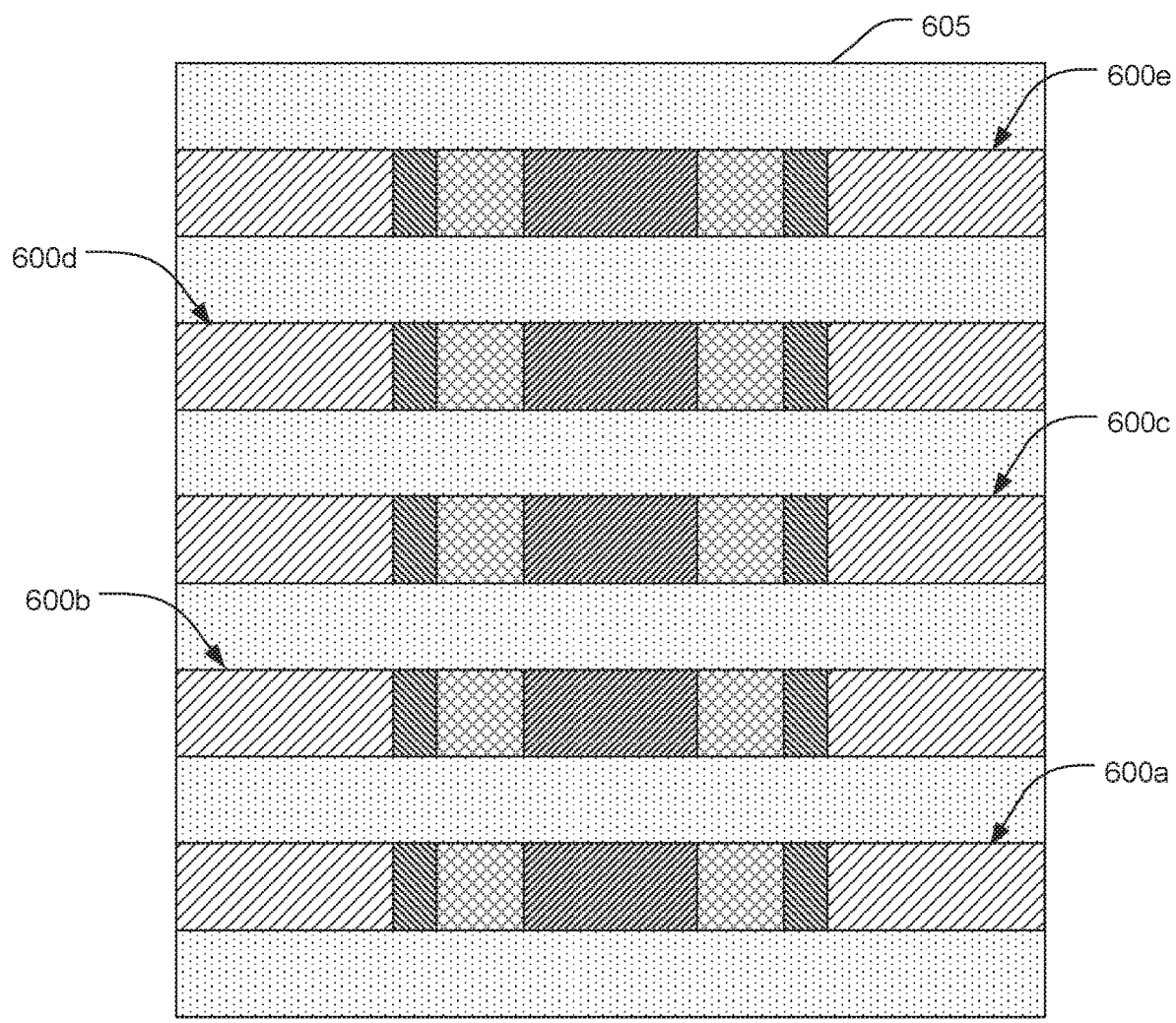
Figure 6J:
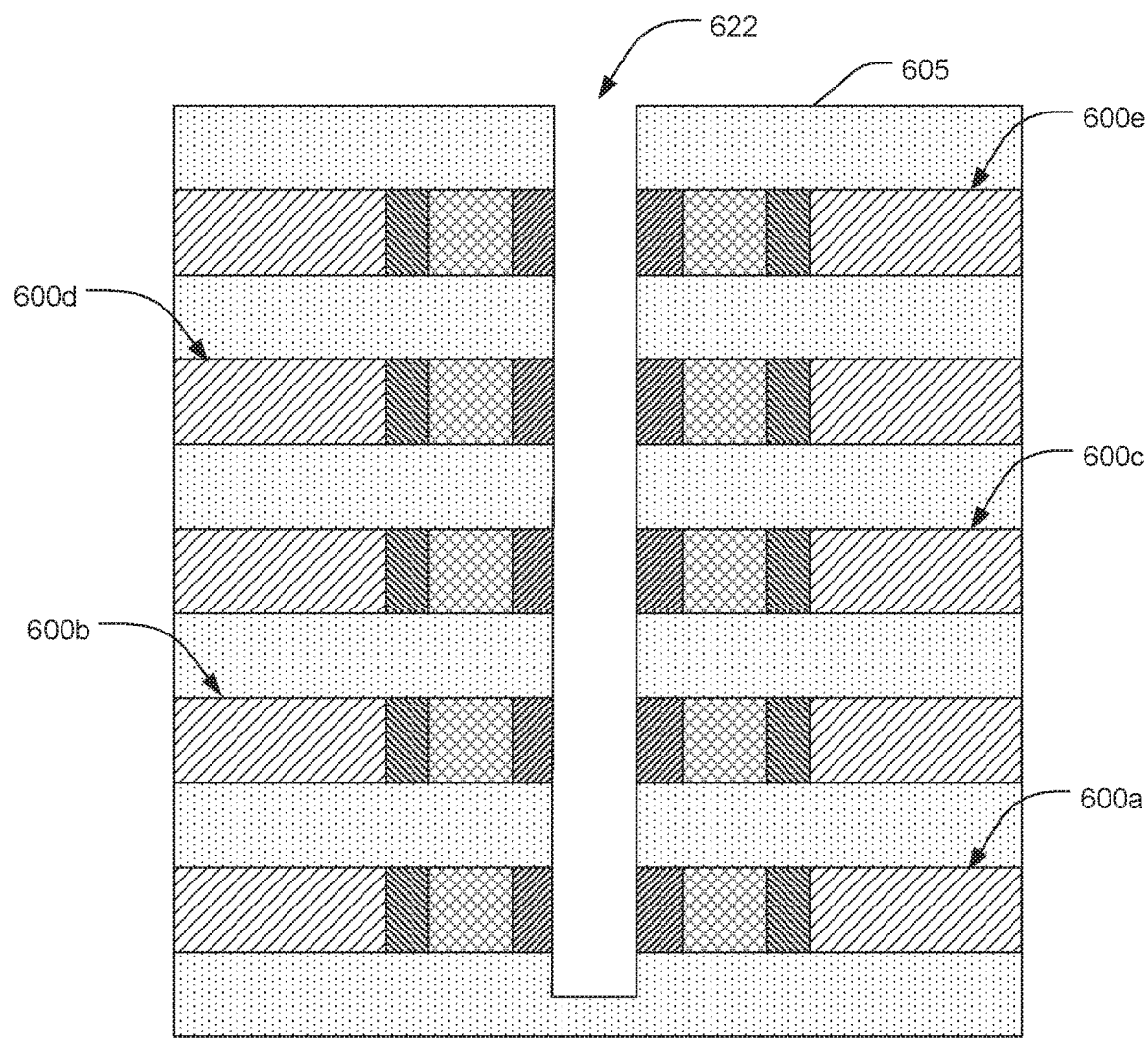

For example, FIG. 6I illustrates a pre-cursor memory structure including a plurality of memory layers 600a-600e individually positioned between dielectric layers 605. As illustrated in FIG. 6J, an interior conductive channel trench 622 can be formed through the plurality of memory layers 600a-600e and dielectric layers 605. More specifically, the interior conductive channel trench 622 can be formed through the interior electrode material 630 of individual memory layers 600a-600e and adjacent dielectric material. Thus, removed portions of interior electrode material 630 from individual memory layers 600a-600e can form individual segments of the interior conductive channel trench 622. Further, in some examples, individual memory layers 600a-500e can be substantially symmetrical about the interior conductive channel trench 622. The interior conductive channel trench 622 can be formed using dry etching, wet etching, the like, or a combination thereof.

Figure 6K:
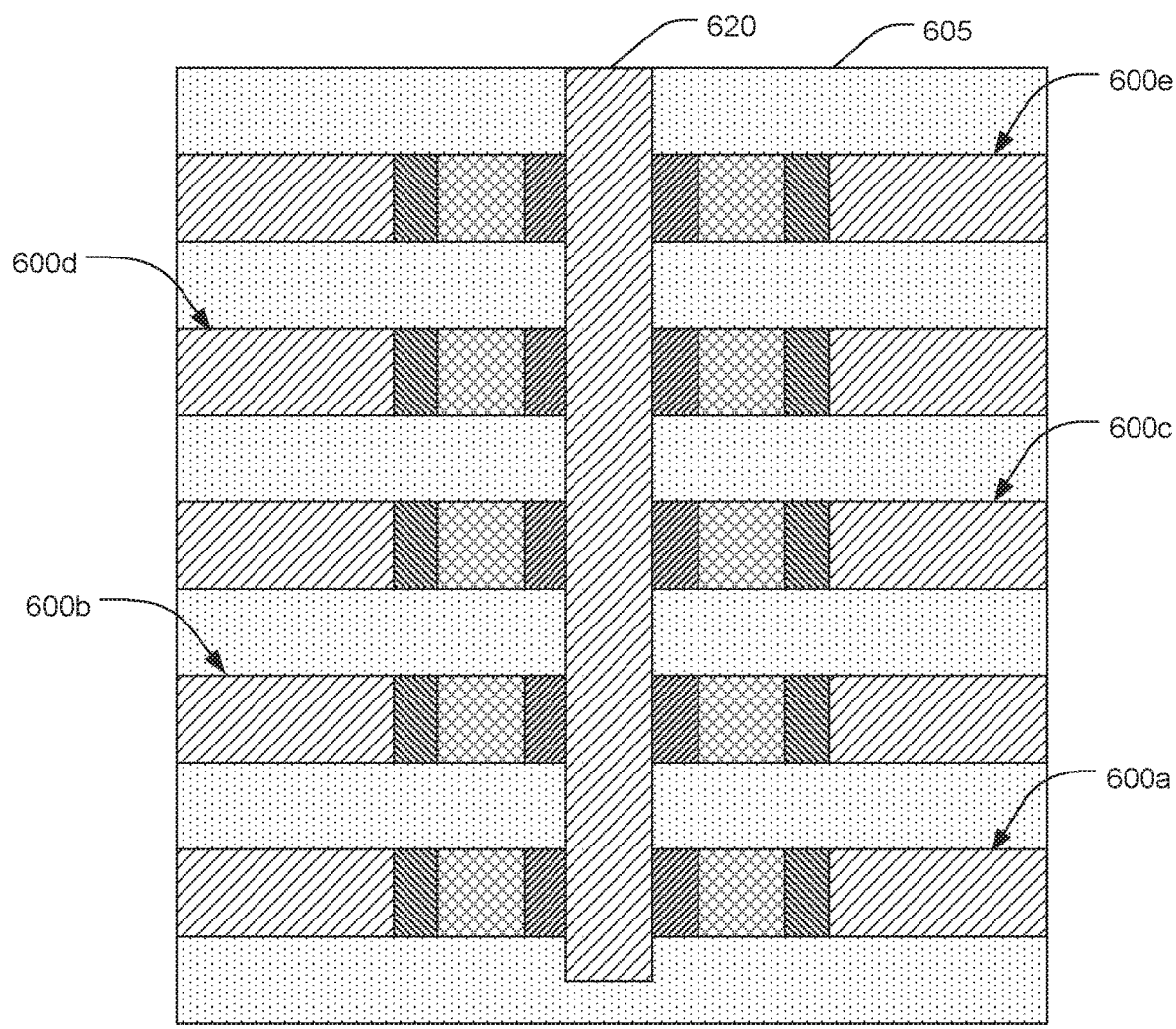

As illustrated in FIG. 6K, the interior conductive channel trench 622 can be filled in with interior conductive channel material to form an interior conductive channel 620. The interior conductive channel 620 can be formed of a variety of suitable materials, such as those described elsewhere herein. The interior conductive channel can be formed by a variety of suitable processes, including CVD, PVD, and the like.

Examples

In one example, there is provided a memory cell, comprising a chalcogenide material configured in an annular shape.

In one example of a memory cell, the chalcogenide material comprises germanium, antimony, tellurium, silicon, nickel, gallium, arsenic, silver, tin, gold, lead, bismuth, indium, selenium, oxygen, sulphur, nitrogen, carbon, yttrium, scandium, and combinations thereof.

In one example of a memory cell, the memory cell further comprises an interior conductive material substantially circumscribed by the chalcogenide material.

In one example of a memory cell, the interior conductive material comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory cell, the interior conductive material is configured as a wordline.

In one example of a memory cell, the memory cell further comprises an interior electrode material between the chalcogenide material and the interior conductive material.

In one example of a memory cell, the interior electrode material comprises carbon, carbon nitride, doped polysilicon, a metal, a conductive metal nitride, a conductive metal silicide, or a combination thereof.

In one example of a memory cell, the interior electrode material substantially circumscribes the interior conductive material.

In one example of a memory cell, the interior electrode material is configured in an annular shape.

In one example of a memory cell, the memory cell further comprises an exterior conductive material substantially circumscribing the chalcogenide material.

In one example of a memory cell, the exterior conductive material comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory cell, the exterior conductive material is configured as a bitline.

In one example of a memory cell, the memory cell further comprises an exterior electrode material between the exterior conductive material and the chalcogenide material.

In one example of a memory cell, the exterior electrode material comprises carbon, carbon nitride, doped polysilicon, a metal, a conductive metal nitride, a conductive metal silicide, or a combination thereof.

In one example of a memory cell, the exterior electrode material substantially circumscribes the chalcogenide material.

In one example of a memory cell, the exterior electrode material is configured in an annular shape.

In one example, there is provided a memory structure, comprising an interior conductive channel and a plurality of alternating dielectric layers and memory layers oriented along the interior conductive channel, individual memory layers comprising a chalcogenide material substantially circumscribing the interior conductive channel.

In one example of a memory structure, the interior conductive channel comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory structure, the interior conductive channel is configured as a wordline.

In one example of a memory structure, individual dielectric layers comprise silicon oxide, silicon nitride, silicon oxynitride, silicon carbide, undoped silicon, or a combination thereof.

In one example of a memory structure, the chalcogenide material comprises germanium, antimony, tellurium, silicon, nickel, gallium, arsenic, silver, tin, gold, lead, bismuth, indium, selenium, oxygen, sulphur, nitrogen, carbon, yttrium, scandium, and combinations thereof.

In one example of a memory structure, the chalcogenide material is configured in an annular shape.

In one example of a memory structure, individual memory layers further comprise an interior electrode material between the chalcogenide material and the interior conductive channel.

In one example of a memory structure, the interior electrode material comprises carbon, carbon nitride, doped polysilicon, a metal, a conductive metal nitride, a conductive metal silicide, or a combination thereof.

In one example of a memory structure, the interior electrode material substantially circumscribes the interior conductive channel.

In one example of a memory structure, the interior electrode material is configured in an annular shape.

In one example of a memory structure, individual memory layers further comprise an exterior conductive material, the chalcogenide material being positioned between the interior conductive channel and the exterior conductive material.

In one example of a memory structure, the exterior conductive material comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory structure, the exterior conductive material substantially circumscribes the chalcogenide material.

In one example of a memory structure, a portion of the exterior conductive material is configured in an annular shape.

In one example of a memory structure, the exterior conductive material is configured as a bitline.

In one example of a memory structure, individual memory layers further comprise an exterior electrode material between the exterior conductive material and the chalcogenide material.

In one example of a memory structure, the exterior electrode material comprises carbon, carbon nitride, doped polysilicon, a metal, a conductive metal nitride, a conductive metal silicide, or a combination thereof.

In one example of a memory structure, the exterior electrode material substantially circumscribes the chalcogenide material.

In one example of a memory structure, the exterior electrode material is configured in an annular shape.

In one example, there is provided a memory device, comprising, an array of memory structures, comprising a plurality of interior conductive channels, a plurality of first level memory cells within a first memory layer, individual first level memory cells comprising chalcogenide material substantially circumscribing individual interior conductive channels at the first memory layer, and a plurality of second level memory cells within a second memory layer, individual second level memory cells comprising chalcogenide material substantially circumscribing individual interior conductive channels at the second memory layer. The memory device further comprises a first level decoder electrically coupled in a first direction to first level memory cells and a second level decoder electrically coupled in a second direction to second level memory cells.

In one example of a memory device, individual interior conductive channels comprise tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory device, individual interior conductive channels are configured as individual wordlines.

In one example of a memory device, the chalcogenide material comprises germanium, antimony, tellurium, silicon, nickel, gallium, arsenic, silver, tin, gold, lead, bismuth, indium, selenium, oxygen, sulphur, nitrogen, carbon, yttrium, scandium, and combinations thereof.

In one example of a memory device, the chalcogenide material is configured in an annular shape.

In one example of a memory device, the first memory layer and the second memory layer are separated by a dielectric layer.

In one example of a memory device, individual memory cells in the first memory layer and the second memory layer further comprise an interior electrode material between the chalcogenide material and the interior conductive channel.

In one example of a memory device, the interior electrode material comprises carbon, carbon nitride, doped polysilicon, a metal, a conductive metal nitride, a conductive metal silicide, or a combination thereof.

In one example of a memory device, the interior electrode material of individual memory cells substantially circumscribes a corresponding interior conductive channel.

In one example of a memory device, the interior electrode material is configured in an annular shape.

In one example of a memory device, individual memory cells in the first memory layer and the second memory layer further comprise an exterior conductive material, the chalcogenide material of individual memory cells being positioned between the interior conductive channel and the exterior conductive material.

In one example of a memory device, the exterior conductive material comprises tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

In one example of a memory device, the exterior conductive material of individual memory cells substantially circumscribes the chalcogenide material.

In one example of a memory device, a portion of the exterior conductive material of individual memory cells is configured in an annular shape.

In one example of a memory device, the exterior conductive material of individual memory cells forms individual bitlines for individual memory cells.

In one example of a memory device, individual memory cells in the first memory layer and the second memory layer are electrically coupled to corresponding first level and second level decoders at the exterior conductive material.

In one example of a memory device, individual memory cells in the first memory layer and the second memory layer further comprise an exterior electrode material between the exterior conductive material and the chalcogenide material.

In one example of a memory device, the exterior electrode material comprises carbon, carbon nitride, doped polysilicon, a metal, a conductive metal nitride, a conductive metal silicide, or a combination thereof.

In one example of a memory device, the exterior electrode material substantially circumscribes the chalcogenide material.

In one example of a memory device, the exterior electrode material is configured in an annular shape.

In one example of a memory device, the first level decoder and the second level decoder are configured as bitline decoders.

In one example of a memory device, the first level decoder and the second level decoder are positioned about a perimeter of the array of memory structures.

In one example of a memory device, the first direction and the second direction are oriented at from 80° to 100° relative to one another.

In one example of a memory device, the first direction and the second direction are oriented at from 40° to 50° relative to one another.

In one example of a memory device, the memory device further comprises an interior conductive channel decoder electrically coupled to individual interior conductive channels.

In one example of a memory device, the interior conductive channel decoder is positioned beneath the first and second memory layers and within the perimeter of the array of memory structures.

In one example, there is provided a computing system, comprising a motherboard and a memory device as described herein operably coupled to the motherboard.

In one example of a computing system, the computing system comprises a desktop computer, a laptop computer, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example, there is provided a method of manufacturing a memory structure, comprising forming a plurality of alternating dielectric layers and memory layers, individual memory layers comprising a chalcogenide material, and forming a conductive channel through the plurality of alternating dielectric layers and memory layers, wherein the conductive channel is substantially circumscribed by the chalcogenide material.

In one example of a method of manufacturing a memory device, forming individual memory layers comprises forming an exterior conductive material layer prior to forming the chalcogenide material.

In one example of a method of manufacturing a memory device, the method further comprises removing a portion of the exterior conductive material layer to form an exterior electrode recess and forming an exterior electrode material in the exterior electrode recess.

In one example of a method of manufacturing a memory device, the exterior conductive material layer substantially circumscribes the exterior electrode material.

In one example of a method of manufacturing a memory device, the method further comprises removing a portion of the exterior electrode material to form a chalcogenide recess and forming the chalcogenide material in the chalcogenide recess.

In one example of a method of manufacturing a memory device, the exterior electrode material substantially circumscribes the chalcogenide material.

In one example of a method of manufacturing a memory device, the method further comprises removing a portion of the chalcogenide material to form an interior electrode recess and forming an interior electrode material in the interior electrode recess.

In one example of a method of manufacturing a memory device, the chalcogenide material substantially circumscribes the interior electrode material.

In one example of a method of manufacturing a memory device, the method further comprises removing a portion of the interior electrode material to form a segment of an interior conductive channel trench.

In one example of a method of manufacturing a memory device, the method further comprises filling the interior conductive channel trench with interior conductive channel material to form the interior conductive channel.

In one example of a method of manufacturing a memory device, the interior electrode material substantially circumscribes the interior conductive channel.

In one example of a method of manufacturing a memory device, the method further comprises removing a portion of the exterior conductive channel layer to form a chalcogenide recess and forming a chalcogenide material in the chalcogenide recess.

In one example of a method of manufacturing a memory device, the method further comprises removing a portion of the chalcogenide material to form an exterior electrode recess and a separate interior electrode recess and forming electrode material in both the exterior electrode recess and the separate interior electrode recess to form an exterior electrode material and an interior electrode material.

In one example of a method of manufacturing a memory device, the exterior electrode material substantially circumscribes the chalcogenide material.

In one example of a method of manufacturing a memory device, the chalcogenide material substantially circumscribes the interior electrode material.

In one example of a method of manufacturing a memory device, the interior electrode material and the exterior electrode material are formed simultaneously.

In one example of a method of manufacturing a memory device, the method further comprises removing a portion of the interior electrode material to form a segment of an interior conductive channel trench.

In one example of a method of manufacturing a memory device, the method further comprises filling the interior conductive channel trench with interior conductive channel material to form the interior conductive channel.

In one example of a method of manufacturing a memory device, the interior electrode material substantially circumscribes the interior conductive channel.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A memory cell, comprising:
   a chalcogenide memory element configured in an annular shape and located between adjacent dielectric layers;
   an interior electrode material configured in an annular shape, wherein the interior electrode material is substantially circumscribed by the chalcogenide memory element and located between the adjacent dielectric layers; and
   an interior conductive material configured as a wordline or a bitline.

2. The memory cell of claim 1, wherein the chalcogenide memory element is selected from the group consisting of germanium, antimony, tellurium, silicon, nickel, gallium, arsenic, silver, tin, gold, lead, bismuth, indium, selenium, oxygen, sulphur, nitrogen, carbon, yttrium, scandium, or combinations thereof.

3. The memory cell of claim 1, wherein the interior conductive material is substantially circumscribed by the chalcogenide memory element.

4. The memory cell of claim 3, wherein the interior conductive material is selected from the group consisting of tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

5. The memory cell of claim 3, wherein the interior conductive material is configured as a wordline.

6. The memory cell of claim 3, wherein the interior electrode material is located between the chalcogenide memory element and the interior conductive material.

7. The memory cell of claim 6, wherein the interior electrode material is selected from the group consisting of carbon, carbon nitride, doped polysilicon, a metal, a conductive metal nitride, a conductive metal silicide, or a combination thereof.

8. The memory cell of claim 6, wherein the interior electrode material substantially circumscribes the interior conductive material.

9. The memory cell of claim 1, further comprising an exterior conductive material substantially circumscribing the chalcogenide memory element.

10. The memory cell of claim 9, wherein the exterior conductive material is selected from the group consisting of tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

11. The memory cell of claim 9, wherein the exterior conductive material is configured as a bitline.

12. The memory cell of claim 9, further comprising an exterior electrode material between the exterior conductive material and the chalcogenide memory element.

13. The memory cell of claim 12, wherein the exterior electrode material is selected from the group consisting of carbon, carbon nitride, doped polysilicon, a metal, a conductive metal nitride, a conductive metal silicide, or a combination thereof.

14. The memory cell of claim 12, wherein the exterior electrode material substantially circumscribes the chalcogenide memory element.

15. The memory cell of claim 14, wherein the exterior electrode material is configured in an annular shape.

16. A memory device, comprising:
   an array of memory structures, comprising:
      a plurality of interior conductive channels configured as individual wordlines or individual bitlines,
      a plurality of first level memory cells within a first memory layer, individual first level memory cells comprising a first chalcogenide memory element disposed about individual interior conductive channels at the first memory layer and located between adjacent dielectric layers, and
      a plurality of second level memory cells within a second memory layer, individual second level memory cells comprising a second chalcogenide memory element disposed about individual interior conductive channels at the second memory layer and located between adjacent dielectric layers,
      wherein individual memory cells in the first memory layer and the second memory layer further comprise an interior electrode material between the first chalcogenide memory element in the first memory layer and the second chalcogenide memory element in the second memory layer and the interior conductive channel;
   a first level decoder electrically coupled in a first direction to first level memory cells; and
   a second level decoder electrically coupled in a second direction to second level memory cells.

17. The memory device of claim 16, wherein individual interior conductive channels is selected from the group consisting of tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof.

18. The memory device of claim 16, wherein the individual interior conductive channels are individual wordlines.

19. The memory device of claim 16, wherein one or more of the first chalcogenide memory element or the second chalcogenide memory element is selected from the group consisting of germanium, antimony, tellurium, silicon, nickel, gallium, arsenic, silver, tin, gold, lead, bismuth, indium, selenium, oxygen, sulphur, nitrogen, carbon, yttrium, scandium, and combinations thereof.

20. The memory device of claim 16, wherein one or more of the first chalcogenide memory element or the second chalcogenide memory element is configured in an annular shape and substantially circumscribes individual interior conductive channels.

21. The memory device of claim 16, wherein the first memory layer and the second memory layer are separated by a dielectric layer.

22. The memory device of claim 16, wherein the individual memory cells in the first memory layer and the second memory layer further comprise an exterior conductive material, the first chalcogenide memory element and the second chalcogenide memory element of individual memory cells being positioned between the interior conductive channel and the exterior conductive material.

23. The memory device of claim 16, wherein the first level decoder and the second level decoder are bitline decoders.

24. The memory device of claim 16, wherein the first level decoder and the second level decoder are positioned about a perimeter of the array of memory structures.

25. The memory device of claim 16, wherein the first direction and the second direction are oriented at from 80° to 100° relative to one another.

26. The memory device of claim 16, wherein the first direction and the second direction are oriented at from 40° to 50° relative to one another.

27. The memory device of claim 16, further comprising an interior conductive channel decoder electrically coupled to individual interior conductive channels.

* * * * *